United States Patent [19]

Tsang

[11] Patent Number: 5,731,768
[45] Date of Patent: Mar. 24, 1998

[54] METHOD AND APPARATUS FOR IMPLEMENTING CODES WITH MAXIMUM TRANSITION RUN LENGTH

[75] Inventor: Kinhing P. Tsang, Plymouth, Minn.

[73] Assignee: Seagate Technology, Inc., Scotts Valley, Calif.

[21] Appl. No.: 594,987

[22] Filed: Jan. 31, 1996

[51] Int. Cl.⁶ .................................. H03M 7/46
[52] U.S. Cl. .................................. 341/59
[58] Field of Search ................ 341/59, 58, 50, 341/93, 94, 82

[56] References Cited

U.S. PATENT DOCUMENTS 5,144,304  9/1992  McMahon ............................. 341/58

*Primary Examiner*—Brian K. Young
*Attorney, Agent, or Firm*—Kinney & Lange, P.A.

[57] ABSTRACT

Encoding and decoding systems for data blocks based on forming corresponding code blocks having a maximum number of successive repetitions of a first symbol and a maximum number of successive repetitions of a second symbol, and having code blocks which can represent plural different ones of said data blocks unambiguously by having further code blocks aid in distinguishing data block is being represented.

19 Claims, 15 Drawing Sheets

| Group A | | Group B | | Group C | | Group D | |
|---|---|---|---|---|---|---|---|
| Binary | HEX | Binary | HEX | Binary | HEX | Binary | HEX |
| 100001 | 21 | 100000 | 20 | 000001 | 01 | 000010 | 02 |
| 100011 | 23 | 100010 | 22 | 010001 | 11 | 000100 | 04 |
| 100101 | 25 | 100100 | 24 | 001001 | 09 | 000110 | 06 |
| 101001 | 29 | 100110 | 26 | 011001 | 19 | 001000 | 08 |
| 101011 | 2B | 101000 | 28 | 000101 | 05 | 001010 | 0A |
| 101101 | 2D | 101010 | 2A | 010101 | 15 | 001100 | 0C |
| 110001 | 31 | 101100 | 2C | 001101 | 0D | 010000 | 10 |
| 110011 | 33 | 110000 | 30 | 000011 | 03 | 010010 | 12 |
| 110101 | 35 | 110010 | 32 | 010011 | 13 | 010100 | 14 |
| | | 110100 | 34 | 001011 | 0B | 010110 | 16 |
| | | 110110 | 36 | 011011 | 1B | 011000 | 18 |
| | | | | | | 011010 | 1A |

| Data (HEX) | State 0 ($S_0$) | | State 1 ($S_1$) | |
|---|---|---|---|---|
| | Codeword (HEX) | Next State | Codeword (HEX) | Next State |
| 00000 (00) | 100000 (20) | $S_0$ | 011000 (18) | $S_0$ |
| 00001 (01) | 100010 (22) | $S_0$ | 000010 (02) | $S_0$ |
| 00010 (02) | 100100 (24) | $S_0$ | 000100 (04) | $S_0$ |
| 00011 (03) | 100110 (26) | $S_0$ | 000110 (06) | $S_0$ |
| 00100 (04) | 101000 (28) | $S_0$ | 001000 (08) | $S_0$ |
| 00101 (05) | 101010 (2A) | $S_0$ | 001010 (0A) | $S_0$ |
| 00110 (06) | 101100 (2C) | $S_0$ | 001100 (0C) | $S_0$ |
| 00111 (07) | 110110 (36) | $S_0$ | 010110 (16) | $S_0$ |
| 01000 (08) | 110000 (30) | $S_0$ | 010000 (10) | $S_0$ |
| 01001 (09) | 110010 (32) | $S_0$ | 010010 (12) | $S_0$ |
| 01010 (0A) | 110100 (34) | $S_0$ | 010100 (14) | $S_0$ |
| 01011 (0B) | 100001 (21) | $S_1$ | 010001 (11) | $S_1$ |
| 01100 (0C) | 100011 (23) | $S_1$ | 010011 (13) | $S_1$ |
| 01101 (0D) | 100101 (25) | $S_1$ | 010101 (15) | $S_1$ |

FIG. 3B

| | | | | |
|---|---|---|---|---|
| 01110 (0E) | | | | |
| 01111 (0F) | 101001 (29) | $S_I$ | 011001 (19) | $S_I$ |
| 10000 (10) | 101011 (2B) | $S_I$ | 011011 (1B) | $S_I$ |
| 10001 (11) | 100000 (20) | $S_I$ | 011000 (18) | $S_I$ |
| 10010 (12) | 100010 (22) | $S_I$ | 000010 (02) | $S_I$ |
| 10011 (13) | 100100 (24) | $S_I$ | 000100 (04) | $S_I$ |
| 10100 (14) | 100110 (26) | $S_I$ | 000110 (06) | $S_I$ |
| 10101 (15) | 101000 (28) | $S_I$ | 001000 (08) | $S_I$ |
| 10110 (16) | 101010 (2A) | $S_I$ | 001010 (0A) | $S_I$ |
| 10111 (17) | 101100 (2C) | $S_I$ | 001100 (0C) | $S_I$ |
| 11000 (18) | 110110 (36) | $S_I$ | 010110 (16) | $S_I$ |
| 11001 (19) | 110000 (30) | $S_I$ | 010000 (10) | $S_I$ |
| 11010 (1A) | 110010 (32) | $S_I$ | 010010 (12) | $S_I$ |
| 11011 (1B) | 110100 (34) | $S_I$ | 010100 (14) | $S_I$ |
| 11100 (1C) | 101101 (2D) | $S_I$ | 001101 (0D) | $S_I$ |
| 11101 (1D) | 110011 (33) | $S_I$ | 000011 (03) | $S_I$ |
| 11110 (1E) | 110101 (35) | $S_I$ | 000101 (05) | $S_I$ |
| 11111 (1F) | 110001 (31) | $S_I$ | 001001 (09) | $S_I$ |
| | 011010 (1A) | | 001011 (0B) | |

| Group A | | Group B | | Group C | | Group D | |
|---|---|---|---|---|---|---|---|
| Binary | HEX | Binary | HEX | Binary | HEX | Binary | HEX |
| 1000001 | 41 | 1000000 | 40 | 0000001 | 01 | 0000010 | 02 |
| 1000011 | 43 | 1000010 | 42 | 0100001 | 21 | 0000100 | 04 |
| 1000101 | 45 | 1000100 | 44 | 0010001 | 11 | 0000110 | 06 |
| 1001001 | 49 | 1000110 | 46 | 0110001 | 31 | 0001000 | 08 |
| 1001011 | 4B | 1001000 | 48 | 0001001 | 09 | 0001010 | 0A |
| 1001101 | 4D | 1001010 | 4A | 0101001 | 29 | 0001100 | 0C |
| 1010001 | 51 | 1001100 | 4C | 0011001 | 19 | 0010000 | 10 |
| 1010011 | 53 | 1010000 | 50 | 0000101 | 05 | 0010010 | 12 |
| 1010101 | 55 | 1010010 | 52 | 0100101 | 25 | 0010100 | 14 |
| 1011001 | 59 | 1010100 | 54 | 0010101 | 15 | 0010110 | 16 |
| 1011011 | 5B | 1010110 | 56 | 0110101 | 35 | 0011000 | 18 |
| 1100001 | 61 | 1011000 | 58 | 0001010 | 0D | 0011010 | 1A |
| 1100011 | 63 | 1011010 | 5A | 0101101 | 2D | 0100000 | 20 |
| 1100101 | 65 | 1100000 | 60 | 0000011 | 03 | 0100010 | 22 |
| 1101001 | 69 | 1100010 | 62 | 0100011 | 23 | 0100100 | 24 |
| 1101011 | 6B | 1100100 | 64 | 0010011 | 13 | 0100110 | 26 |
| 1101101 | 6D | 1100110 | 66 | 0110011 | 33 | 0101000 | 28 |
| | | 1101000 | 68 | 0001011 | 0B | 0101010 | 2A |
| | | 1101010 | 6A | 0101011 | 2B | 0101100 | 2C |
| | | 1101100 | 6C | 0011011 | 1B | 0110000 | 30 |
| | | | | | | 0110010 | 32 |
| | | | | | | 0110100 | 34 |
| | | | | | | 0110110 | 36 |

FIG. 6

| Group A | | Group B | | Group C | | Group D | |
|---|---|---|---|---|---|---|---|
| Binary | HEX | Binary | HEX | Binary | HEX | Binary | HEX |
| Group AA | | Group BD | | Group CD | | Group D1 | |
| 1100011 | 63 | 1000000 | 40 | 0000001 | 01 | 0000100 | 04 |
| 1101011 | 6B | 1000010 | 42 | 0100001 | 21 | 0000110 | 06 |
| | | 1000100 | 44 | 0010001 | 11 | 0001000 | 08 |
| Group AB | | 1000110 | 46 | 0110001 | 31 | 0001010 | 0A |
| 1100001 | 61 | 1001000 | 48 | 0001001 | 09 | 0010000 | 10 |
| 1100101 | 65 | 1001010 | 4A | 0101001 | 29 | 0010010 | 12 |
| 1101001 | 69 | 1001100 | 4C | 0011001 | 19 | 0010100 | 14 |
| 1101101 | 6D | 1010000 | 50 | 0000101 | 05 | 0010110 | 16 |
| | | 1010010 | 52 | 0100101 | 25 | 0100100 | 24 |
| Group AC | | 1010100 | 54 | 0010101 | 15 | 0100110 | 26 |
| 1000011 | 43 | 1010110 | 56 | 0110101 | 35 | 0101000 | 28 |
| 1001011 | 4B | 1011000 | 58 | 0001010 | 0D | 0101010 | 2A |
| 1010011 | 53 | 1011010 | 5A | 0101101 | 2D | 0110000 | 30 |
| 1011011 | 5B | | | | | 0110010 | 32 |
| | | Group BB | | Group CC | | 0110100 | 34 |
| Group AD | | 1100000 | 60 | 0000011 | 03 | 0110110 | 36 |
| 1000001 | 41 | 1100010 | 62 | 0100011 | 23 | | |
| 1000101 | 45 | 1100100 | 64 | 0010011 | 13 | Group D2 | |
| 1001001 | 49 | 1100110 | 66 | 0110011 | 33 | 0000010 | 02 |
| 1001101 | 4D | 1101000 | 68 | 0001011 | 0B | 0001100 | 0C |
| 1010001 | 51 | 1101010 | 6A | 0101011 | 2B | 0011000 | 18 |
| 1010101 | 55 | 1101100 | 6C | 0011011 | 1B | 0011010 | 1A |
| 1011001 | 59 | | | | | 0100000 | 20 |
| | | | | | | 0100010 | 22 |
| | | | | | | 0101100 | 2C |

FIG. 7

|  | State 0 (S₀) | | State 1 (S₁) | | State 2 (S₂) | | State 3 (S₃) | |
| --- | --- | --- | --- | --- | --- | --- | --- | --- |
| Data (HEX) | Codeword (HEX) | Next State | Codeword (HEX) | Next State | Codeword (HEX) | Next State | Codeword (HEX) | Next State |
| 000000 (00) | 1100001 (61) | S₂ | 1001101 (4D) | S₂ | 0000010 (02) | S₀ | 0000100 (04) | S₀ |
| 000001 (01) | 1100101 (65) | S₂ | 1000010 (42) | S₀ | 0011000 (18) | S₀ | 0000110 (06) | S₀ |
| 000010 (02) | 1101001 (69) | S₂ | 1000100 (44) | S₀ | 0011010 (1A) | S₁ | 0001000 (08) | S₀ |
| 000011 (03) | 1101101 (6D) | S₂ | 1000110 (46) | S₀ | 0011000 (18) | S₁ | 0001010 (0A) | S₀ |
| 000100 (04) | 1100001 (61) | S₃ | 1001000 (48) | S₀ | 0011010 (1A) | S₁ | 0010000 (10) | S₀ |
| 000101 (05) | 1100101 (65) | S₃ | 1001010 (4A) | S₀ | 0100000 (20) | S₃ | 0010010 (12) | S₀ |
| 000110 (06) | 1101001 (69) | S₃ | 1001100 (4C) | S₀ | 0000011 (03) | S₀ | 0010100 (14) | S₀ |
| 000111 (07) | 1101101 (6D) | S₃ | 1001101 (4D) | S₃ | 0001100 (0C) | S₂ | 0010110 (16) | S₀ |
| 001000 (08) | 1100000 (60) | S₀ | 1010000 (50) | S₀ | 0000011 (03) | S₂ | 0100100 (24) | S₀ |
| 001001 (09) | 1100010 (62) | S₀ | 1010010 (52) | S₀ | 0011000 (18) | S₂ | 0100110 (26) | S₀ |
| 001010 (0A) | 1100100 (64) | S₀ | 1010100 (54) | S₀ | 0011010 (1A) | S₃ | 0101000 (28) | S₀ |
| 001011 (0B) | 1100110 (66) | S₀ | 1010110 (56) | S₀ | 0011000 (18) | S₃ | 0101010 (2A) | S₀ |
| 001100 (0C) | 1101000 (68) | S₀ | 1011000 (58) | S₀ | 0011010 (1A) | S₀ | 0110000 (30) | S₀ |
| 001101 (0D) | 1101010 (6A) | S₀ | 1011010 (5A) | S₃ | 0100000 (20) | S₀ | 0110010 (32) | S₀ |
| 001110 (0E) | 1101100 (6C) | S₂ | 1010001 (51) | S₂ | 0100010 (22) | S₀ | 0110100 (34) | S₀ |
| 001111 (0F) | 1000011 (43) | S₂ | 1010001 (51) | S₃ | 0101100 (2C) | S₀ | 0110110 (36) | S₀ |

| Input | Code A | State | Code B | State | Code C | State | Code D | State |
|---|---|---|---|---|---|---|---|---|
| 010000 (10) | 1100001 (61) | S₁ | 1000101 (45) | S₁ | 0000010 (02) | S₁ | 0000100 (04) | S₁ |
| 010001 (11) | 1100101 (65) | S₁ | 1000010 (42) | S₁ | 0100001 (21) | S₁ | 0000110 (06) | S₁ |
| 010010 (12) | 1101001 (69) | S₁ | 1000100 (44) | S₁ | 0010001 (11) | S₁ | 0001000 (08) | S₁ |
| 010011 (13) | 1101101 (6D) | S₁ | 1000110 (46) | S₁ | 0110001 (31) | S₁ | 0001010 (0A) | S₁ |
| 010100 (14) | 1001011 (4B) | S₂ | 1001000 (48) | S₁ | 0001001 (09) | S₁ | 0010000 (10) | S₁ |
| 010101 (15) | 1011011 (5B) | S₂ | 1001010 (4A) | S₁ | 0101001 (29) | S₁ | 0010010 (12) | S₁ |
| 010110 (16) | 1001011 (4B) | S₃ | 1001100 (4C) | S₁ | 0011001 (19) | S₁ | 0010100 (14) | S₁ |
| 010111 (17) | 1011011 (5B) | S₃ | 1001001 (49) | S₁ | 0001100 (0C) | S₁ | 0010110 (16) | S₁ |
| 011000 (18) | 1100000 (60) | S₁ | 1010000 (50) | S₁ | 0000101 (05) | S₁ | 0100100 (24) | S₁ |
| 011001 (19) | 1100010 (62) | S₁ | 1010010 (52) | S₁ | 0100101 (25) | S₁ | 0100110 (26) | S₁ |
| 011010 (1A) | 1100100 (64) | S₁ | 1010100 (54) | S₁ | 0010101 (15) | S₁ | 0101000 (28) | S₁ |
| 011011 (1B) | 1100110 (66) | S₁ | 1010110 (56) | S₁ | 0110101 (35) | S₁ | 0101010 (2A) | S₁ |
| 011100 (1C) | 1101000 (68) | S₁ | 1011000 (58) | S₁ | 0001101 (0D) | S₁ | 0110000 (30) | S₁ |
| 011101 (1D) | 1101010 (6A) | S₁ | 1011010 (5A) | S₁ | 0101101 (2D) | S₁ | 0110010 (32) | S₁ |
| 011110 (1E) | 1101100 (6C) | S₁ | 1010101 (55) | S₁ | 0100010 (22) | S₁ | 0110100 (34) | S₁ |
| 011111 (1F) | 1000011 (43) | S₃ | 1011001 (59) | S₁ | 0101100 (2C) | S₁ | 0110100 (34) | S₁ |

| Data (HEX) | State 0 (S₀) | | State 1 (S₁) | | State 2 (S₂) | | State 3 (S₃) | |
|---|---|---|---|---|---|---|---|---|
| | Codeword (HEX) | Next State | Codeword (HEX) | Next State | Codeword (HEX) | Next State | Codeword (HEX) | Next State |
| 100000 (20) | 1100011 (63) | S₂ | 1000101 (45) | S₂ | 0000010 (02) | S₂ | 0000100 (04) | S₂ |
| 100001 (21) | 0100011 (23) | S₂ | 1000010 (42) | S₂ | 0100001 (21) | S₂ | 0000110 (06) | S₂ |
| 100010 (22) | 0010011 (13) | S₂ | 1000100 (44) | S₂ | 0010001 (11) | S₂ | 0001000 (08) | S₂ |
| 100011 (23) | 0110011 (33) | S₂ | 1000110 (46) | S₂ | 0110001 (31) | S₂ | 0001010 (0A) | S₂ |
| 100100 (24) | 0001011 (0B) | S₂ | 1001000 (48) | S₂ | 0001001 (09) | S₂ | 0010000 (10) | S₂ |
| 100101 (25) | 0101011 (2B) | S₂ | 1001010 (4A) | S₂ | 0101001 (29) | S₂ | 0010010 (12) | S₂ |
| 100110 (26) | 0011011 (1B) | S₂ | 1001100 (4C) | S₂ | 0011001 (19) | S₂ | 0010100 (14) | S₂ |
| 100111 (27) | 1101011 (6B) | S₂ | 1001001 (49) | S₂ | 0001100 (0C) | S₂ | 0010110 (16) | S₂ |
| 101000 (28) | 1000001 (41) | S₂ | 1010000 (50) | S₂ | 0000101 (05) | S₂ | 0100100 (24) | S₂ |
| 101001 (29) | 1100010 (62) | S₂ | 1010010 (52) | S₂ | 0100101 (25) | S₂ | 0100110 (26) | S₂ |
| 101010 (2A) | 1100100 (64) | S₂ | 1010100 (54) | S₂ | 0010101 (15) | S₂ | 0101000 (28) | S₂ |
| 101011 (2B) | 1100110 (66) | S₂ | 1010110 (56) | S₂ | 0110101 (35) | S₂ | 0101010 (2A) | S₂ |
| 101100 (2C) | 1101000 (68) | S₂ | 1011000 (58) | S₂ | 0001101 (0D) | S₂ | 0110000 (30) | S₂ |
| 101101 (2D) | 1101010 (6A) | S₂ | 1011010 (5A) | S₂ | 0101101 (2D) | S₂ | 0110010 (32) | S₂ |
| 101110 (2E) | 1101100 (6C) | S₂ | 1010101 (55) | S₂ | 0100010 (22) | S₂ | 0110100 (34) | S₂ |
| 101111 (2F) | 1010011 (53) | S₂ | 1011001 (59) | S₂ | 0101100 (2C) | S₂ | 0110110 (36) | S₂ |

| | | S3 | | S3 | | S3 | | S3 |
|---|---|---|---|---|---|---|---|---|
| 110000 (30) | 1100011 (63) | | 1000101 (45) | | 0000010 (02) | | 0000100 (04) | |
| 110001 (31) | 0100011 (23) | | 1000010 (42) | | 0100001 (21) | | 0000110 (06) | |
| 110010 (32) | 0010011 (13) | | 1000100 (44) | | 0010001 (11) | | 0001000 (08) | |
| 110011 (33) | 0110011 (33) | | 1000110 (46) | | 0110001 (31) | | 0001010 (0A) | |
| 110100 (34) | 0001011 (0B) | | 1001000 (48) | | 0001001 (09) | | 0010000 (10) | |
| 110101 (35) | 0101011 (2B) | | 1001010 (4A) | | 0101001 (29) | | 0010010 (12) | |
| 110110 (36) | 0011011 (1B) | | 1001100 (4C) | | 0011001 (19) | | 0010100 (14) | |
| 110111 (37) | 1101011 (6B) | | 1001001 (49) | | 0001100 (0C) | | 0010110 (16) | |
| 111000 (38) | 1000001 (41) | | 1010000 (50) | | 0000101 (05) | | 0100100 (24) | |
| 111001 (39) | 1100010 (62) | | 1010010 (52) | | 0100101 (25) | | 0100110 (26) | |
| 111010 (3A) | 1100100 (64) | | 1010100 (54) | | 0010101 (15) | | 0101000 (28) | |
| 111011 (3B) | 1100110 (66) | | 1010110 (56) | | 0110101 (35) | | 0101010 (2A) | |
| 111100 (3C) | 1101000 (68) | | 1011000 (58) | | 0001101 (0D) | | 0110000 (30) | |
| 111101 (3D) | 1101010 (6A) | | 1011010 (5A) | | 0101101 (2D) | | 0110010 (32) | |
| 111110 (3E) | 1101100 (6C) | | 1010101 (55) | | 0100010 (22) | | 0110100 (34) | |
| 111111 (3F) | 1010011 (53) | | 1011001 (59) | | 0101100 (2C) | | 0110110 (36) | |

METHOD AND APPARATUS FOR IMPLEMENTING CODES WITH MAXIMUM TRANSITION RUN LENGTH

BACKGROUND OF THE INVENTION

The present invention relates in general to information storage systems and, more particularly, to a method and apparatus for implementing maximum transition run (MTR) codes in a digital data magnetic recording system. In digital data magnetic recording systems, digital data is recorded in a moving magnetic media layer by a storage, or "write" electrical current-to-magnetic field transducer, or "head", positioned immediately adjacent thereto. The data is stored or written to the magnetic media by switching the direction of flow of a substantially constant magnitude write current which flows through windings in the write transducer. Each write current direction transition results in a reversal of the magnetization direction in that portion of the magnetic media just passing by the transducer during current flow in the new direction, with respect to the magnetization direction in the media induced by the previous current flow in the opposite direction. In one scheme (NRZI), a magnetization direction reversal over a portion of the media moving past the transducer represents a binary digit "1", and the lack of any reversal in that portion represents a binary digit "0".

When such recorded data is to be recovered, a retrieval, or "read" magnetic field-to-voltage transducer, (which may be the same as the write transducer if both are inductive) is positioned to have the magnetic media, containing previously stored data, pass thereby such that flux reversal regions in that media either induce, or change a circuit parameter to provide, a voltage pulse to form an output read signal for that transducer. Such a read signal has an analog character in the recording retrieval process. In the scheme described above, each such voltage pulse due to the magnetizations in corresponding media portions is taken to represent a binary digit "1" and the absence of a pulse in correspondence with such portions because of no magnetization reversals therein is taken to represent a binary digit "0".

In digital magnetic recording systems, the times between voltage pulses are used to reconstruct the timing information concerning the time base used in recording the data previously stored in the magnetic media to define the path portions described above. More specifically, the output of the read signal information detector is used as an input signal to a phase-locked loop forming a controlled oscillator, or phase-lock oscillator (PLO), or synchronizer, which produces an output clock signal from the positions of the detected peaks of the read signal. In other words, the PLO locks the phase of the timing clock signal to the phase of the signal resulting from peak detection of the read signal voltage pulses. Absolute time is not used in operating the data retrieval system portion since the rotational speed of the motor which drives the magnetic media varies over time both during recording and retrieval which results in nonuniform time intervals between read signal voltage pulses.

A data encoding scheme known as run-length-limited (RLL) coding is commonly used to improve the PLO's reconstructed clock signal accuracy based on avoiding drift in the frequency thereof because of too much time occurring between successive voltage read signal pulses. When RLL code is employed, the time durations between read signal voltage pulse transitions is bounded, that is, effectively, the number of binary digits of value "0" that can separate binary digits of value "1" in the read signal is limited. This constraint is known overall as a (d,k) constraint where the individual constraint "d" represents the minimum run length of zeros, or the number thereof between ones, while the individual constraint "k" represents the maximum run length of zeros permitted. The "d" portion of the constraint can be chosen so as to avoid crowding of voltage pulses in the read signals which can reduce intersymbol interference problems in which portions of read signal voltage pulses overlap. By limiting the number of consecutive zeros, the "k" constraint maintains the reliability of the PLO in providing an accurate clock signal for the retrieval system. An automatic gain control (AGC) system is usually used to maintain signal amplitude in the retrieval signal processing channel, and the "k" restraint also maintains the reliability of the AGC.

As the recording densities become greater, the result is that transitions representing binary "1's" become recorded very close to each other in the magnetic media such that severe intersymbol-interference results. At densities considerably greater than those in currently commercially available products, the most likely error sequence has been demonstrated to consist of write patterns that contain three or more unspaced consecutive transitions. A class of block codes that limits the number of consecutive symbol transitions, typically representing binary "1's", are known as maximum transition run (MTR) codes. To avoid three or more consecutive transitions, codes with MTR values (no more than two successive binary "1's" in the coding result) equal to two are desirable.

When data is encoded into codewords that satisfy certain constraints, data words (blocks of successive coding symbols typically binary "1's" and "0's") having "m" successive bits are translated into code words (blocks of successive coding symbols again typically binary "1's" and "0's") having "n" bits where "n" is greater than "m". The ratio "m/n" of the data word symbol length to the codeword symbol length is known as the code rate, "r". The upper bound of the MTR=2 code rate in which k=∞ has been found to be 0.8791 as indicated in the Seagate Annual Report. This upper bound is also known as the capacity of the code. This means there exists MTR codes with MTR=2 that map m data bits into n code bits as long as the ratio of m to n is smaller than 0.8791. For practical implementation, m and n are usually chosen to be small integers and the ratio m/n is as close to the code capacity as possible.

To design a MTR code with MTR=2 having a rate of m/n and using one-to-one block mapping in which the "m" data symbols, or binary data bits, in a block are mapped into the "n" code symbols, or binary data bits, in a block, an exhaustive search of the possible n bit blocks is used to find $2^m$ different n-bit words which satisfy the MTR=2 constraint. In addition, in order for these words to satisfy the MTR=2 constraint when concatenated as code words, the bit patterns therein must begin and end with '00', '01' or '10'. That is, bit patterns can be considered in these words found in the exhaustive search which start or end with '11' and those words can be invalidated insofar as being used as code words. For instance, if n=5 and if one removes all the 5-bit words having three or more consecutive "1's", having bit patterns that start or end with '11', and the all zero bit pattern word, there are exactly $2^4$ or 16 words which remain. This is just enough to form a 4/5 rate MTR code with MTR=2 using one-to-one mapping between the data words and the code words.

However, when attempting to extend this method to a 5/6 rate MTR code with MTR=2, there are only thirty words with valid bit patterns available, two short of the $2^5$ or 32 words required. Although one may achieve the same code rate by mapping 10-bit data words to 12-bit data words, the $2^{10}$ or 1024 code words will significantly complicate the encoder and decoder which use Boolean logic to implement the bit pattern mapping. Thus, in the context of the above example, there is a desire to provide an encoding algorithm which satisfies the MTR=2 constraint that is easy to implement using Boolean logic and is not limited by invalid patterns beginning or ending with '11'. Of course, the present invention is not limited to such codes which satisfy the MTR=2 constraint, but rather is applicable to any such code regardless of the coding constraints chosen.

SUMMARY OF THE INVENTION

The present invention provides a system for encoding selected data blocks having selected ordered symbols therein into corresponding code blocks having selected ordered symbols therein numbering more than the symbols in the data blocks with the data blocks received at a receiver in the system. An encoder provides a corresponding said code block for each of the data block, such that each of the code blocks, and any concatenations thereof, are without more than a preselected number of successive repetitions of a first symbol throughout, and without more than a preselected number of successive repetitions of a second symbol throughout. In addition, any of said code blocks that can be provided for more than one of different ones of the data blocks, in coming to the receiver to represent a data block, comes in a concatenation of code blocks such that such that a code block that can represent more than one different data block comes to the receiver together with at least one other code block in the concatenation so that they are together sufficient to determine which of the different ones of the data blocks that could be represented is being represented. The symbols in the blocks can be from the binary number system.

BRIEF DESCRIPTION OF THE DRAWINGS

FIG. 2 is a table illustrating all of the 6obit binary patterns which satisfy the MTR=2 constraint according to the present invention;

FIG. 3 is a code word assignment and next state table of a 5/6 rate MTR=2, k=9 code according to the present invention;

FIG. 6 is a table illustrating all of the 7-bit binary patterns which satisfy the MTR=2 constraint according to the present invention;

FIG. 7 is a table of sub-groups of the 7-bit patterns which satisfy the MTR=2 constraint according to the present invention;

FIGS. 8A and 8B are a code word assignment and next state table of a 6/7 rate MTR=2, k=9 code according to the present invention;

DETAILED DESCRIPTION OF THE PREFERRED EMBODIMENTS

Figure 1:
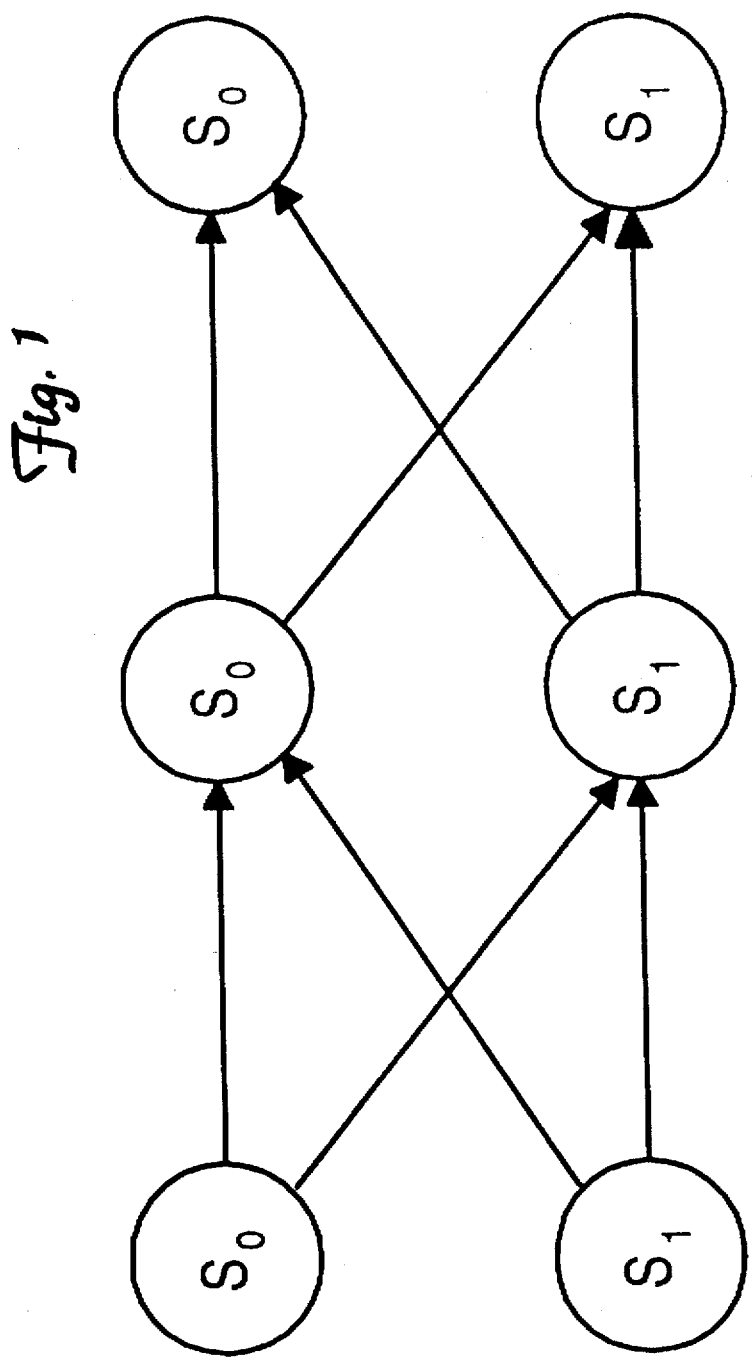
FIG. 1 is a two-state trellis diagram for associating concatenated code word bit patterns with each other according to the present invention.

To achieve a m/n rate equal to 5/6 in an MTR code with MTR=2 using code words of 6 bits in length (n=6), an initial list is provided of all such 6 bit words including those that begin or end with bit patterns '11'. According to the present invention, these 6-bit words are assigned to branchings to the next state during a state transition from a selected corresponding state in a finite state machine represented by a two-state trellis diagram in such a manner that invalid patterns (three or more consecutive 1's) do not occur when these code words are concatenated. Referring to FIG. 1, the two states in the trellis diagram are indicated there as state $S_0$ and state $S_1$ which have been found to be sufficient in number for this code. Two branches are shown leading into and out of each of the states $S_0$ and $S_1$ if viewed across the entire diagram, but with each of the branches shown in fact representing several branches in parallel.

As shown in FIG. 2, an exhaustive search of this initial list is made to find all of the 6-bit words in the list having bit patterns therein which satisfy the MTR=2 constraint results in the listing shown there after being divided into four selected groups of words based on selected bit patterns in those words:

Group A: '1XXXX1' (9 different words),

Group B: '1XXXX0' (11 different words),

Group C: '0XXXX1' (11 different words),

Group D: '0XXXX0' (12 different words), where X represents either a "1" or an "0". This grouping is, as indicated, based on the bit patterns of the two end bits in each of these words.

In order to limit the resulting code to having the MTR value therefor equal to two in concatenations of the code words resulting from successive transmissions thereof, constraints are imposed on the transition branches in the trellis diagram so that the branches may only be associated with certain code words having suitable bit patterns to avoid the occurrence of three or more successive "1's". If all code words arising upon state transitions leaving states along branches leading to a state $S_0$ in the diagram have bit patterns that are restricted to those that end with '0', code words arising upon a subsequent state transition along branches leaving that $S_0$ state can be from any group. If all code words arising upon state transitions along branches leaving a state $S_1$ in the diagram have bit patterns that are restricted to those that begin with '0', code words arising in an immediately preceding state transition along branches leading to that state $S_1$ can be from any group. As a result of following these constraints, the above code word groups are acceptable to arise along each branch as listed below:

$S_0$ to $S_0$ Branch: Groups B and D (end with "0"), $S_0$ to $S_1$ Branch: Groups A, B and D (all but these chosen to allow a unique state assignment as set out below)

$S_1$ to $S_0$ Branch: Groups D (begin and end with "0"), $S_1$ to $S_1$ Branch: Groups C and D (begin with "0").

In order to make the code words uniquely decodable and limit the error propagation, code words arising upon leaving each state in a state transition must be unique. That means each code word cannot be used upon transitions from more than one state. Groups A and B are assigned so that code words arise therefrom upon state transitions along branches leaving just state $S_0$ in view of their association with branches leaving that state as shown above, and Groups C and D are assigned so that code words arise therefrom upon state transitions along branches leaving state $S_1$ for that same reason. However, since this is a 5/6 rate code, $2^5$ or 32 different code words are necessary for transitions from each state so that a data word can be represented by each such transition, but code words assigned for branchings from a selected state can be repeated for branchings from that state to each of the different next states branched to therefrom since they will still be uniquely decodable because of their differing next state characteristics. The use of the fewest states possible, of course, tends to reduce complexity and cost.

One code word '011010' from Group D is therefore moved to arise on transitions from state $S_0$ (which group is also associated with branches leaving that state in the second listing above) to thereby provide 32 code words available to arise on transitions from that state. As a result, that moved code word now forms Group D" leaving the rest of former Group D to now form Group D'. The code words are, as a result, distributed to the branches as follows:

From $S_0$ to $S_0$: B (11 different words) and D" (1 word),
From $S_0$ to $S_1$: A (9 different words) and B (11 different words),
From $S_1$ to $S_0$: D' (11 different words),
From $S_1$ to $S_1$: C (11 different words) and D' (11 different words).

There is thus a total of 32 code words for branchings from state $S_0$, and 33 words for branchings from state $S_1$ thus showing two states in the finite state machine to be sufficient. To keep the "0's" run length "k" constraint small, we may eliminate the former code word '000001' from Group C to form Group C' and so then leave 32 code words for branchings from state $S_1$ also. FIG. 3 shows the next state table of the resulting maximum transition run code having a 5/6 rate with MTR=2 and k=9, providing the next state and code word corresponding to each data word for branchings from both of states $S_0$ and $S_1$ during state transitions, and showing the corresponding hexadecimal value for these words. The k=9 constraint is equaled when the code words '100000' and '000010' occur successively in a transmission thereof.

Since the code words are unique to the branchings from each state, the decoder will only have to look ahead one code word. For example, the code word '36' (hex) may be received by the decoder. This code word from the table of FIG. 3 can be seen there to be the possible result of either data words '07' or '17' (hex). To determine which, the decoder must check on the next code word and determine whether it was associated branchings from either state $S_0$ or state $S_1$ as it is uniquely associated with one or the other. If the next code word is one resulting from a branching from state $S_0$, the data word '07' (hex) will be the decoded output since state $S_0$ was the next state of the preceding code word '36' (hex) now being decoded that represented data word '07' (hex), otherwise the next code word is from state $S_1$ and data word '17' (hex) is decoded. Errors confined to a single code word will thus only affect two decoded data words, that data word represented by the erroneous code word and the preceding data word for which the erroneous code word was the next code word.

The logic structures of the encoder and decoder for the maximum transition run code set out in the table of FIG. 3, having a rate 5/6 with MR=2 and k=9, can be expressed in Boolean logic expressions in which a "*" between Boolean variables denotes an AND logic operation, a "+" between Boolean variables denotes an OR logic operation, and a "−" over a Boolean variable denotes a NOT logic operation. These Boolean functions can be implemented into such encoders and decoders by well known logic gate circuits in well known manners based on forming a finite state machine therewith. Alternatively, such encoders and decoders can be similarly implemented in a microprocessor, or microprocessors, in well known manners.

Figure 4A:
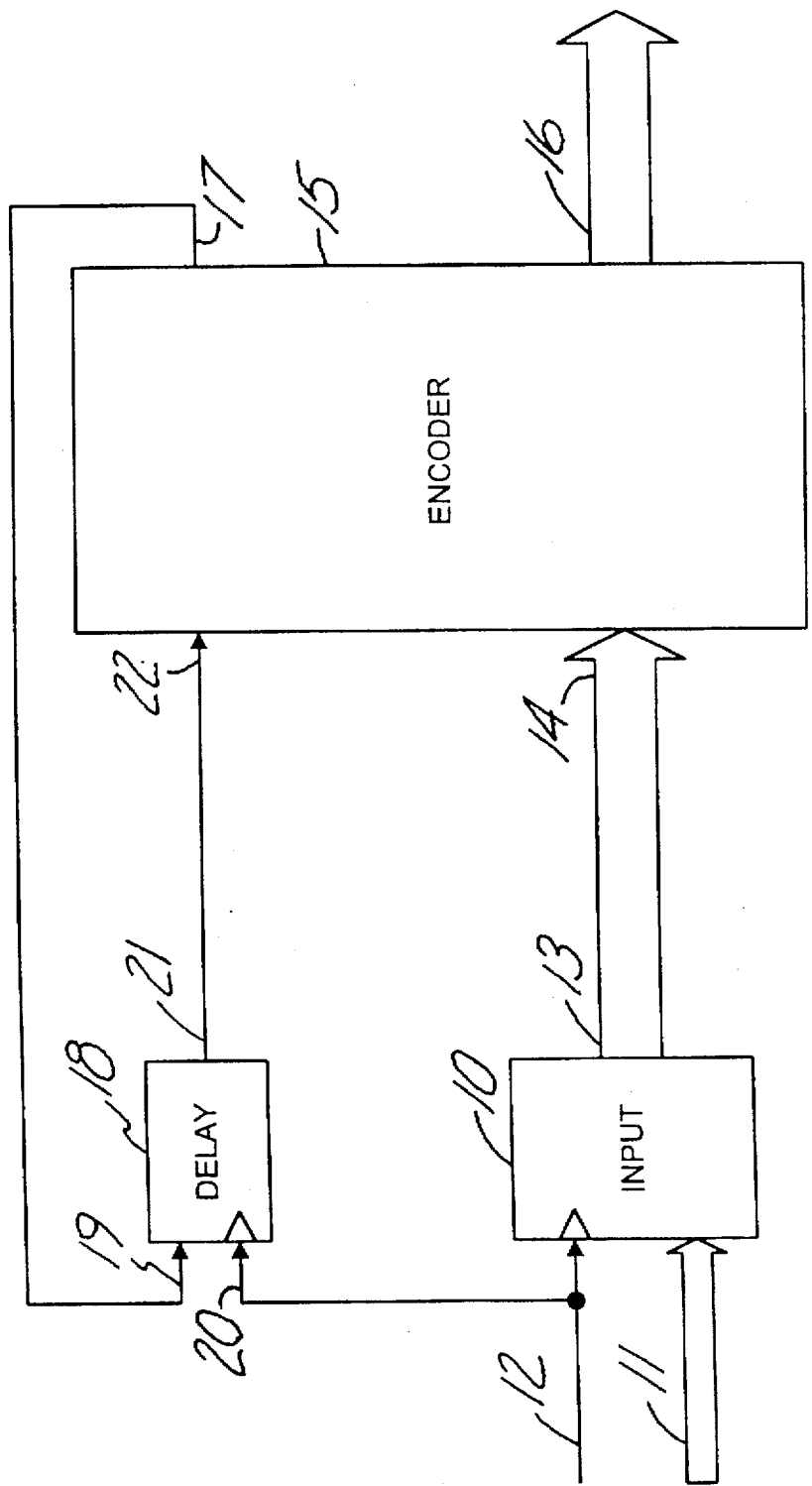
FIG. 4A is a block diagram of an encoder for the 5/6 rate code of FIG. 3.

In the encoder system shown in block diagram form in FIG. 4A, each input data word of five bits $A_4, A_3, A_2, A_1$ and $A_0$ is successively supplied to a clocked five bit input register, 10, as the data word receiver at a system input, 11, during a corresponding period of the system clocking signal supplied at a clock signal input, 12. Each such input data word stored in input register 10 is transferred during the next clock period from an output, 13, of that register into an input, 14, of an encoder, 15, comprising a finite state machine based on the table in FIG. 3 to be encoded into a code word of six bits $C_5, C_4, C_3, C_2, C_1$ and $C_0$ provided at a code word output, 16, of that encoder. From the table of FIG. 3, we can see the input data words are divided into two groups. The first group of data words extends '00' to '0A' (hex) and, for state transitions from either state $S_0$ or state $S_1$, has state $S_0$ as its next state. The second group of data words extends from '0B' to '1F' (hex) and, for state transitions from either state $S_0$ or state $S_1$, has state $S_1$ as its next state. Data words can be identified as being from two sublists in the data word listing, data words in the listing from '00' (hex) to '0A' (hex) and from '10' (hex) to '1A' (hex), by the following expression taking a Boolean value of 1:

$$KK=\bar{A}_3+(\bar{A}_2*(\bar{A}_1+\bar{A}_0)).$$  [Eq. 1]

Since data words in this first group for state transitions from either state $S_0$ or state $S_1$ have the next state as $S_0$, and the data words from the second group do not, negating KK and placing it in an OR relationship with the fourth data word digit $A_4$ allows the next state to be expressed by the equation $$Ns=\overline{KK}+A_4$$  [Eq. 2]

for use in encoder 15. Ns=0 represents state $S_0$ as the next state, and Ns=1 represents state $S_1$ as the next state.

The bits of the code words arising on branchings from state $S_0$ during state transitions as set out in the table of FIG. 3 can be expressed as follows for use in encoder 15:

$$YA_5=KK+\bar{A}_4+A_4*(\bar{A}_2+\bar{A}_2+\bar{A}_0),$$  [Eq. 3]

$$YA_4=KK*(A_3+A_2*A_1*A_0)+\overline{KK}*(A_4*A_2)$$  [Eq. 4]

$$YA_3=KK*(A_2*(\bar{A}_1+\bar{A}_0))+\overline{KK}*(\bar{A}_4*A_2*A_1+A_4*A_1*A_0),$$  [Eq. 5]

$$YA_2=KK*A_1+\overline{KK}*(H_{13}+A_4*H_{11}),$$  [Eq. 6]

$$YA_1=KK*A_0+\overline{KK}*(H_{12}+H_{15}),$$  [Eq. 7]

$$YA_0=\overline{KK}*(\bar{A}_4+H_{15}),$$  [Eq. 8]

where the corresponding Boolean variables $H_x$ are defined below.

The bits of the code words arising on branchings from state $S_1$ during state transitions as set out in the table of FIG. 3 can be expressed as follows again for use in encoder 15:

$$YB_5=0,$$  [Eq. 9]

$$YB_4=KK*(A_3+A_2*A_1*A_0)+KK*H_0+\overline{KK}*A_4,$$  [Eq. 10]

$$YB_3=KK*(A_2*(\bar{A}_1+\bar{A}_0)+H_0)+\overline{KK}*(\bar{A}_4A_2*A_1+A_4*A_1),$$  [Eq. 11]

$$YB_2=KK*A_1+\overline{KK}*(H_{13}+A_4*H_{11}),$$  [Eq. 12]

$$YB_1=KK*A_0+\overline{KK}*(H_{12}+H_{15}),$$  [Eq. 13]

$$YB_0 = \overline{KK}. \quad [\text{Eq. 14}]$$

The corresponding Boolean variables $H_x$ used in the preceding encoding expressions for the code word bits are defined as follows:

$$H_0 = \bar{A}_3 * \bar{A}_2 * \bar{A}_1 * \bar{A}_0, \quad [\text{Eq. 15}]$$

$$H_{11} = A_3 * \bar{A}_2 * A_1 * A_0, \quad [\text{Eq. 16}]$$

$$H_{12} = A_3 * A_2 * \bar{A}_1 * \bar{A}_0, \quad [\text{Eq. 17}]$$

$$H_{13} = A_3 * A_2 * \bar{A}_1 * A_0, \quad [\text{Eq. 18}]$$

$$H_{15} = A_3 * A_2 * A_1 * A_0. \quad [\text{Eq. 19}]$$

The output code words of the encoder are provided by the code word bits $C_5$, $C_4$, $C_3$, $C_2$, $C_1$ and $C_0$ formed by selecting the proper one of the corresponding preceding code word bit expressions from the two sets thereof through use of the next state expression associated therewith delayed by one state transition (or one system clock period) to provide the current state indication therefor, the expressions for the six code word bits being as follows:

$$C_5 = \bar{Ks} * YA_5 + Ks * YB_5, \quad [\text{Eq. 20}]$$

$$C_4 = \bar{Ks} * YA_4 + Ks * YB_4, \quad [\text{Eq. 21}]$$

$$C_3 = \bar{Ks} * YA_3 + Ks * YB_3, \quad [\text{Eq. 22}]$$

$$C_2 = \bar{Ks} * YA_2 + Ks * YB_2, \quad [\text{Eq. 23}]$$

$$C_1 = \bar{Ks} * YA_1 + Ks * YB_1, \quad [\text{Eq. 24}]$$

$$C_0 = \bar{Ks} * YA_0 + Ks * YB_0, \quad [\text{Eq. 25}]$$

Here $Ks$ is a bit representing the current state, and it is the bit $Ns$ provided at a next state output, 17, of encoder 15 delayed by one state transition, or clock period, in a clocked one bit delay register, 18, having its next state input, 19, connected to encoder output 17. The system clock signal is also provided to register 18 at a clocking input, 20, thereof. An output, 21, of register 18 is connected to a current state input, 22, of encoder 15.

Figure 4B:
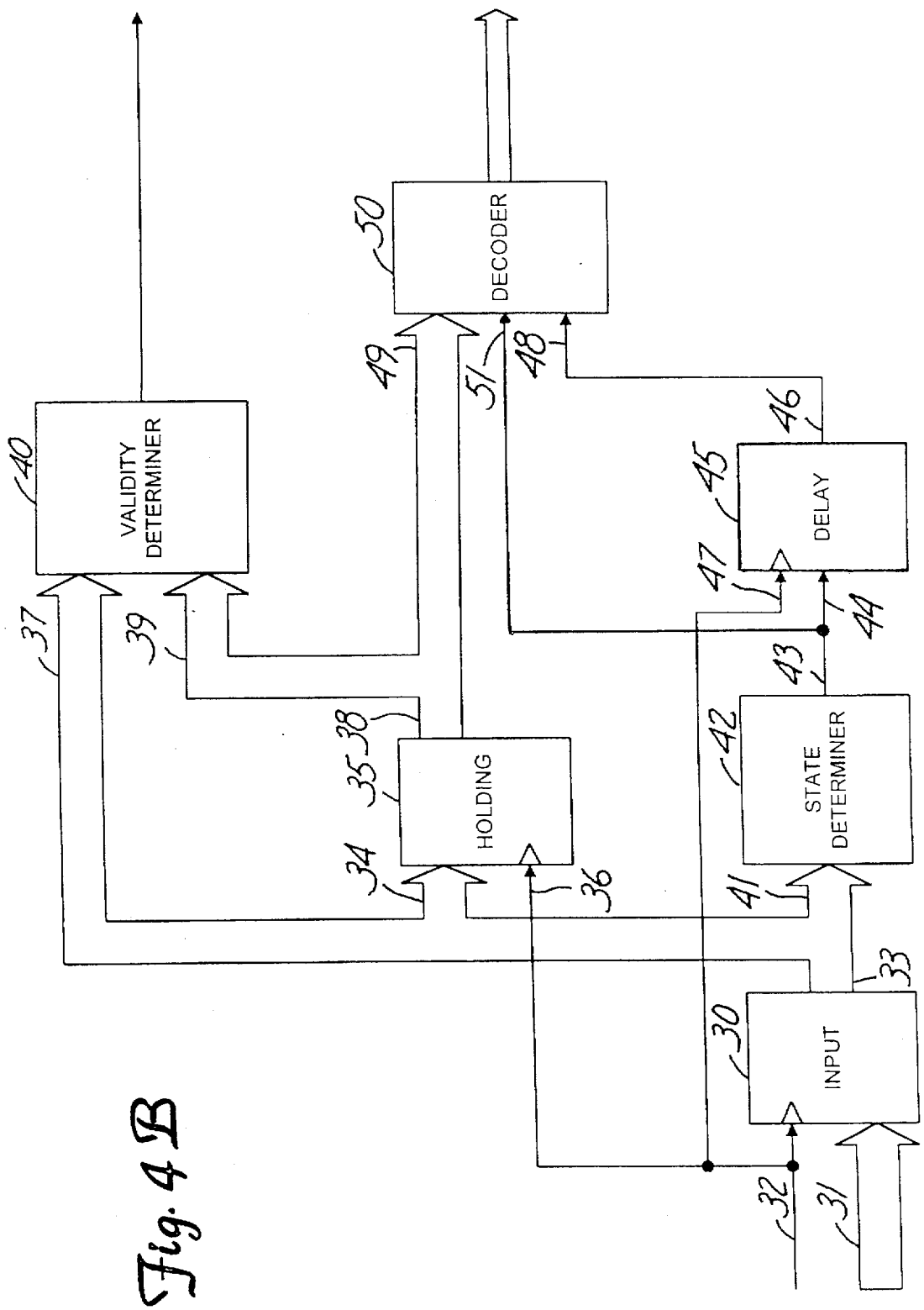
FIG. 4B is a block diagram of a decoder for the 5/6 rate code of FIG. 3.

In the corresponding decoder system for this 5/6 rate MTR code shown in block diagram form in FIG. 4B, output data words formed of five bits $A_4$, $A_3$, $A_2$, $A_1$ and $A_0$ are recovered based on successive pairs of input code words of six bits each taken from a sequence thereof where each input code word in such a pair occurs in succession the sequence thereof. Current code words, provided by bits $C_5$, $C_4$, $C_3$, $C_2$, $C_1$ and $C_0$, carry the information as to corresponding current states of the encoder, and the code word next following the current code word, provided by the bits $C_{11}, C_{10}, C_9, C_8, C_7$, and $C_6$, carries the information as to the corresponding next encoder state. Together, they point to the corresponding unique data word to result from the decoding process in the decoder.

In this decoder system, each input code word of six bits is successively supplied to a clocked six bit input register, 30, at a system input, 31, during a corresponding period of the system clocking signal supplied at a clock signal input, 32. Each such input data word stored in input register 30 represents the following or next code word ($C_{11}, C_{10}, C_9, C_8, C_7, C_6$) after storage in input register 30, but is transferred during the next clock period from an output, 33, of that register into an input, 34, of another clocked six bit holding register, 35, where it becomes the current code word ($C_5, C_4, C_3, C_2, C_1, C_0$) after storage therein. The system clock signal is also applied to a clocking input, 36, of register 35. The new input code word stored in input register 30 during the time the preceding code word is stored in holding register 35 then becomes the next code word during the time held in register 30.

The code word in input register 30, as the next code word, is also supplied at output 33 thereof to a first input, 37, as is the current code word from an output, 38, of delay register 35 to a second input, 39, of a code word legality checker, 40. If the six code bits in any code word received form an illegal code word representing an eliminated six bit word (any of the words that were eliminated in forming Groups A, B, C, (D' and D" above), a flag signal taking a Boolean value of 1 at the output of checker 40 will indicate so as a basis for a user to arrange some corresponding action if desired. This flag signal LL as implemented in checker 40 can be expressed as:

$$LL = L_1 + L_2 + L_3 + L_4, \quad [\text{Eq. 26}]$$

where $$L_1 = C_5 * C_4 * C_3 + C_4 * C_3 * C_2 + C_3 * C_2 * C_1 + C_2 * C_1 * C_0, \quad [\text{Eq. 27}]$$

$$L_2 = \bar{C}_5 * \bar{C}_4 * \bar{C}_3 * \bar{C}_2 * \bar{C}_1, \quad [\text{Eq. 28}]$$

$$L_3 = C_{11} * C_{10} * C_9 + C_{10} * C_9 * C_8 + C_9 * C_8 * C_7 + C_8 * C_7 * C_6, \quad [\text{Eq. 29}]$$

$$L_4 = \bar{C}_{11} * \bar{C}_{10} * \bar{C}_9 * \bar{C}_8 * \bar{C}_7. \quad [\text{Eq. 30}]$$

The current states of the received code words imposed by the encoder can be expressed by the equations:

$$Ts_0 = (C_5 * C_0) + (\bar{C}_5 * \bar{C}_0) + (G_1 * H_{10}), \quad [\text{Eq. 31}]$$

$$Ts_1 = (\bar{C}_5 * \bar{C}_0) + (\bar{C}_5 * C_0 * (\bar{C}_4 + C_4 * (\bar{C}_3 + (C_3 * \bar{C}_1)))), \quad [\text{Eq. 32}]$$

where $G_1$ and $H_{10}$ are defined below. $Ts_0=1$ indicates state $S_0$ is the current state and $Ts_1=1$ indicates state $S_1$ is the current state. These two states can be represented in one bit by $Ks$ by $$Ks = Ts_1. \quad [\text{Eq. 33}]$$

Rather than using the expression preceding the last directly to form the last expression to obtain the current state, the decoder system determines the next state and then delays use of it for one state transition to thereby then have it represent the current state. This is accomplished through the code word in input register 30, as the next code word, being also supplied at output 33 thereof to an input, 41, of a state determiner, 42. The next states of the encoder corresponding to the input code words received in input register 30 can be expressed by the equation:

$$Ns = (\bar{C}_{11} * C_6) + (\bar{C}_{11} * \bar{C}_6 * (\bar{C}_{10} + C_{10} * (\bar{C}_9 + (C_9 * \bar{C}_7)))). \quad [\text{Eq. 34}]$$

$Ns=0$ indicates state $S_0$ is the next state, and $Ns=1$ indicates state $S_1$ is the next state. This expression, implemented in determiner 42, provides the next state at an output, 43, thereof connected to an input, 44, of a clocked one bit delay register, 45, having an output, 46, at which is provided the current state indication. Delay register 45 also has a further clocking input, 47, to receive the system clock signal.

Output 46 of delay register 45 is connected to a first input, 48, and output 38 of holding register 35 is connected to a second input, 49, of a decoder, 50, to thereby provide the current state indication and the current code word to that decoder. In addition, output 43 of state determiner 42 is connected to decoder 50 at a third input, 51, thereof to provide the next state indication thereto. For the implementation of the decoding logic gates in decoder 50, the code words are divided into four groups A'=A+D", B, C and D' as described above taking into account the final adjustments made in the assignment of code words to transition branchings from the states. Code words can be identified as belonging to these groups by the corresponding variables $K_a$, $K_b$, $K_c$ and $K_d$ in the expressions below taking a Boolean value of 1:

Group A') $K_a=(C_5*C_0)+(G_1*H_{10})$, [Eq. 35]

Group B) $K_b=C_5*\bar{C}_0$, [Eq. 36]

Group C') $K_c=(\bar{C}_5*C_0)*(C_4+C_3+C_2+C_1)$, [Eq. 37]

Group D') $K_d=\bar{C}_5*\bar{C}_0*(\bar{C}_4+C_4*(\bar{C}_3+(C_3*\bar{C}_1)))$. [Eq. 38]

Here, the code word taken from Group D to thereby form Group D" as described above has been added to Group A to form Group A' leaving Group D' consisting of the rest of former Group D. Group C' is formed from Group C less the word eliminated therefrom above.

The data word bits recovered from received code words arising on branchings from state $S_0$ during state transitions as set out in the table of FIG. 3 can be expressed as follows for use in decoder 50 based on the variables for identifying code words from Groups A' and B:

$XA_4=(K_a*(C_4+C_3*C_2))+(K_b*N_s)$, [Eq. 39]

$XA_3=K_a+(K_b*(C_4*(\bar{C}_2+\bar{C}_1)))$, [Eq. 40]

$XA_2=(K_a*(C_4+C_1+H_5+H_9))+(K_b*(C_3+(C_4*C_2*C_1)))$, [Eq. 41]

$XA_1=(K_a*(C_3+H_1))+(K_b*C_2)$, [Eq. 42]

$XA_0=(K_a*(C_2+\bar{C}_5+G_2*(H_1+H_{11})))+(K_b*C_1)$, [Eq. 43]

where the corresponding Boolean variables $G_x$ and $H_x$ are defined below.

The data word bits recovered from received code words arising on branchings from state $S_1$ during state transitions as set out in the table of FIG. 3 can be expressed as follows again for use in decoder 50 but based on the variables for identifying code words from Groups C' and D":

$XB_4=(K_c*\bar{C}_4)+(K_d*N_s)$, [Eq. 44]

$XB_3=K_c+(K_d*(C_4*\bar{C}_3*(\bar{C}_2+\bar{C}_1)))$, [Eq. 45]

$XB_2=(K_c*\bar{H}_1*\bar{H}_{13})+(K_d*((\bar{C}_4*C_3)+(C_4*C_2*C_1)))$, [Eq. 46]

$XB_1=(K_c*(C_3+H_1))+(K_d*C_2)$, [Eq. 47]

$XB_0=(K_c*(C_2+H_1+H_{11}))+(K_d*C_1)$. [Eq. 48]

The corresponding Boolean variables $G_x$ and $H_x$ used in the preceding decoding expressions for the data word bits are defined as follows:

$G_1=\bar{C}_5*C_4$ [Eq. 50]

$H_1=\bar{C}_3*\bar{C}_2*\bar{C}_1*C_0$ [Eq. 51]

$H_5=\bar{C}_3*C_2*\bar{C}_1*C_0$ [Eq. 52]

$H_9=C_3*\bar{C}_2*\bar{C}_1*C_0$ [Eq. 53]

$H_{10}=C_3*\bar{C}_2*C_1*\bar{C}_0$ [Eq. 54]

$H_{11}=C_3*\bar{C}_2*C_1*C_0$ [Eq. 55]

$H_{13}=C_3*C_2*\bar{C}_1*C_0$ [Eq. 56]

The output data words of the encoder are provided by the code word bits $A_4$, $A_3$, $A_2$, $A_1$ and $A_0$ at the output of decoder 50 formed by selecting the proper one of the corresponding two preceding data word bit expressions through use of the next state expression delayed by one state transition (or one system clock period) to provide the current state indication, the expressions therefor being as follows:

$A_4=\bar{Ks}*XA_4+Ks*XB_4$, [Eq. 57]

$A_3=\bar{Ks}*XA_3+Ks*XB_3$, [Eq. 58]

$A_2=\bar{Ks}*XA_2+Ks*XB_2$, [Eq. 59]

$A_1=\bar{Ks}*XA_1+Ks*XB_1$, [Eq. 60]

$A_0=\bar{Ks}*XA_0+Ks*XB_0$, [Eq. 61]

Ks is the current state indication provided at the output of delay register 45.

Figure 5:
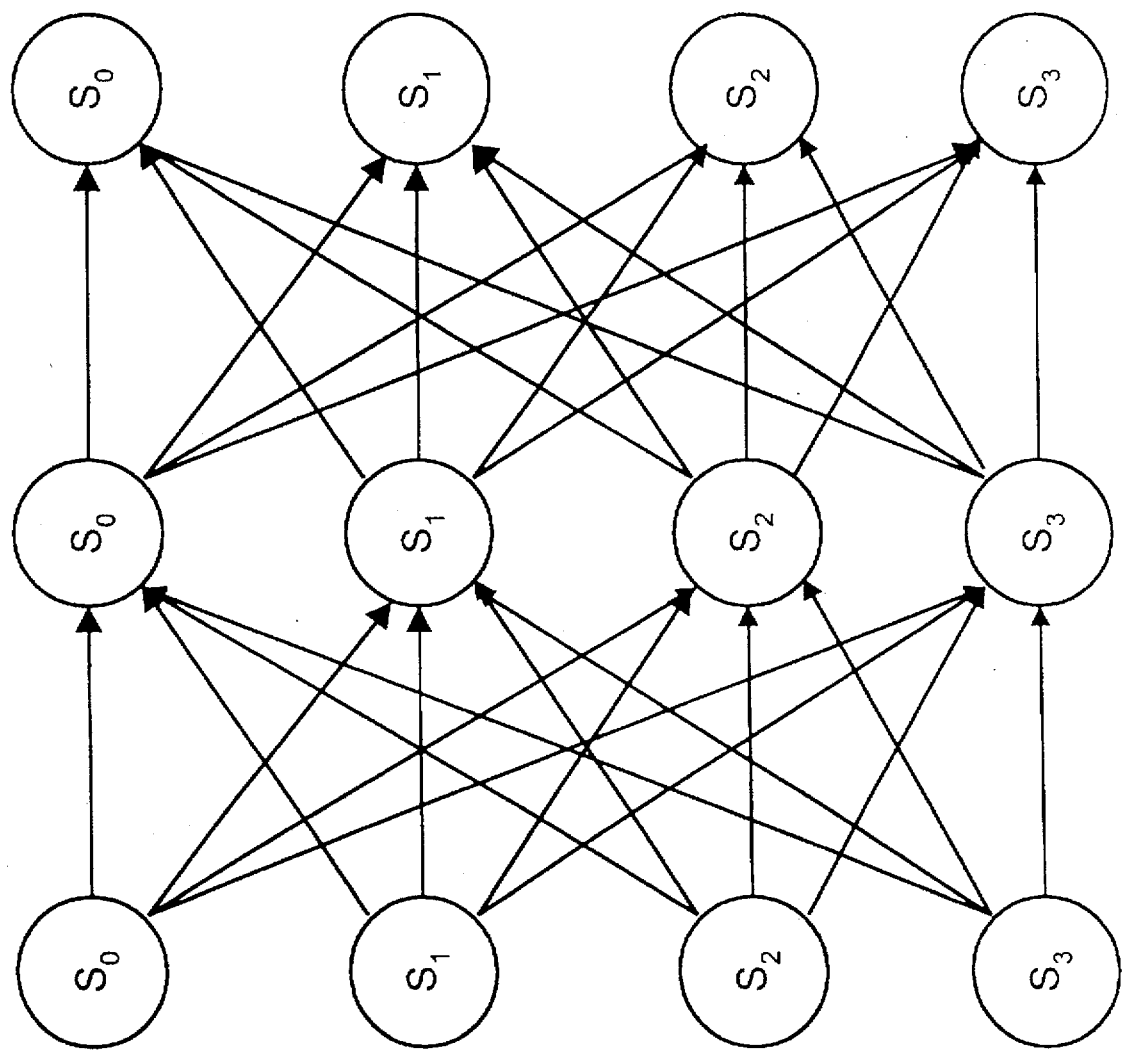
FIG. 5 is a four-state trellis diagram for associating concatenated code word bit patterns with each other according to another embodiment of the present invention.

A further maximum transition run code example is provided by such a code having a 6/7 rate with MTR=2 and k=9 using a 4-state trellis diagram as shown in FIG. 5 with again the branches shown representing several branches in parallel. To implement this code, all of the possible 7-bit blocks or words, excluding those not satisfying MTR=2, are divided into four groups of possible code words based on those bit patterns involving the end bits of each such word just as was done for the 5/6 rate code design above. As a result, there are 17 such blocks or words in Group A with the bit pattern given therefor above, 20 such words in each of Groups B and C with the bit patterns corresponding to those patterns given above for those groups, and 23 such words in Group D with the corresponding bit pattern given therefor above, as shown in the table of FIG. 6. A 6/7 rate code needs $2^6$ or 64 different code words for transitions from each state so that a different data word can be represented by each such transition from a state. The code words in these four groups have been found to be insufficient in number to implement such a code with this rate using either a 2-state or 3-state trellis.

To implement this code in a finite state machine represented by a 4-state trellis, we further restrict certain words for branchings from each state. Words arising on branchings from state $S_0$ may begin with any two bits including '11', and so words arising on branchings leading to state $S_0$ must end with '0' to satisfy MTR=2 in code word concatenations arising from branchings into and out of that state. Words arising on branchings from state $S_1$ may only begin with '10', and so words arising on branchings to state $S_1$ may end with '00' or '01' again to satisfy MTR=2 in code word concatenations arising from branchings into and out of that state. Words arising on branchings from either of states $S_2$ and $S_3$ only begin with '0', and so any words arising on branchings leading to states $S_2$ and $S_3$ are satisfactory. With these restrictions, the four groups of words indicated above can be further divided into subgroups as follows:

Group A:
  Group AA: '11XXX11' (2 different words),
  Group AB: '11XXX01' (4 different words),
  Group AC: '10XXX11' (4 different words),
  Group AD: '10XXX01' (7 different words),
Group B:
  Group BD: '10XXXX0' (13 different words),
  Group BB: '11XXXX0' (7 different words),
Group C:
  Group CD: '0XXXX01' (13 different words),
  Group CC: '0XXXX11' (7 different words),
Group D: '0XXXXX0' (23 different words),
where X='0' or '1'. Again, code words arising from branchings from in each state must be unique in order for the code words to be uniquely decodable and to limit any error propagation. Group D is further divided into two groups (D' and D") such that sixteen words therein are used in one state and the other seven words are used in another state. To satisfy the 64 different words per state requirement, we may assign the words to branches as follows:

From $S_0$ to $S_0$: BB (7 different words),
From $S_0$ to $S_1$: AB and BB (4+7=11 different words),
From $S_0$ to $S_2$: AA, AB, AC, BB and CC (2+4+4+7+7=24 different words),
From $S_0$ to $S_3$: AA, AB, AC, BB and CC (2+4+4+7+7=24 different words),
From $S_1$ to $S_0$: BD (13 different words),
From $S_1$ to $S_1$: AD and BD (7+13=20 different words),
From $S_1$ to $S_2$: AD and BD (7+13=20 different words),
From $S_1$ to $S_3$: AD and BD (7+13=20 different words),
From $S_2$ to $S_0$: D' (7 different words),
From $S_2$ to $S_1$: CD and D' (13+7=20 different words),
From $S_2$ to $S_2$: CD and D' (13+7=20 different words),
From $S_2$ to $S_3$: CD and D' (13+7=20 different words),
From $S_3$ to $S_0$: D" (16 different words),
From $S_3$ to $S_1$: D" (16 different words),
From $S_3$ to $S_2$: D" (16 different words),
From $S_3$ to $S_3$: D" (16 different words).

There is a total of 66 different words for $S_0$, a total of 73 different words for $S_1$, a total of 67 different words for $S_2$, and a total of 64 different words for $S_3$ as shown in the table of FIG. 7. This satisfies the minimum requirement of a total of 64 different words per state with some to spare. Some adjustment can be made in order to keep the "k" constraint small. Words '1000000' from Group BD and '0000001' from Group CD are eliminated to avoid long runs of zero to form Groups BD' and CD'. Word '1000001' of Group AD is moved to transition from state $S_0$. Word '0000011' of Group CC is moved to transition from state $S_2$. FIG. 8 shows the next state table of the resulting maximum transition run code having a 6/7 rate with MTR=2 and k=9. The k=9 constraint is equaled when either of the code words '1010000' or '0010000' is followed by either of code words '0000010' or '0000011' in sequence.

Figure 9A:
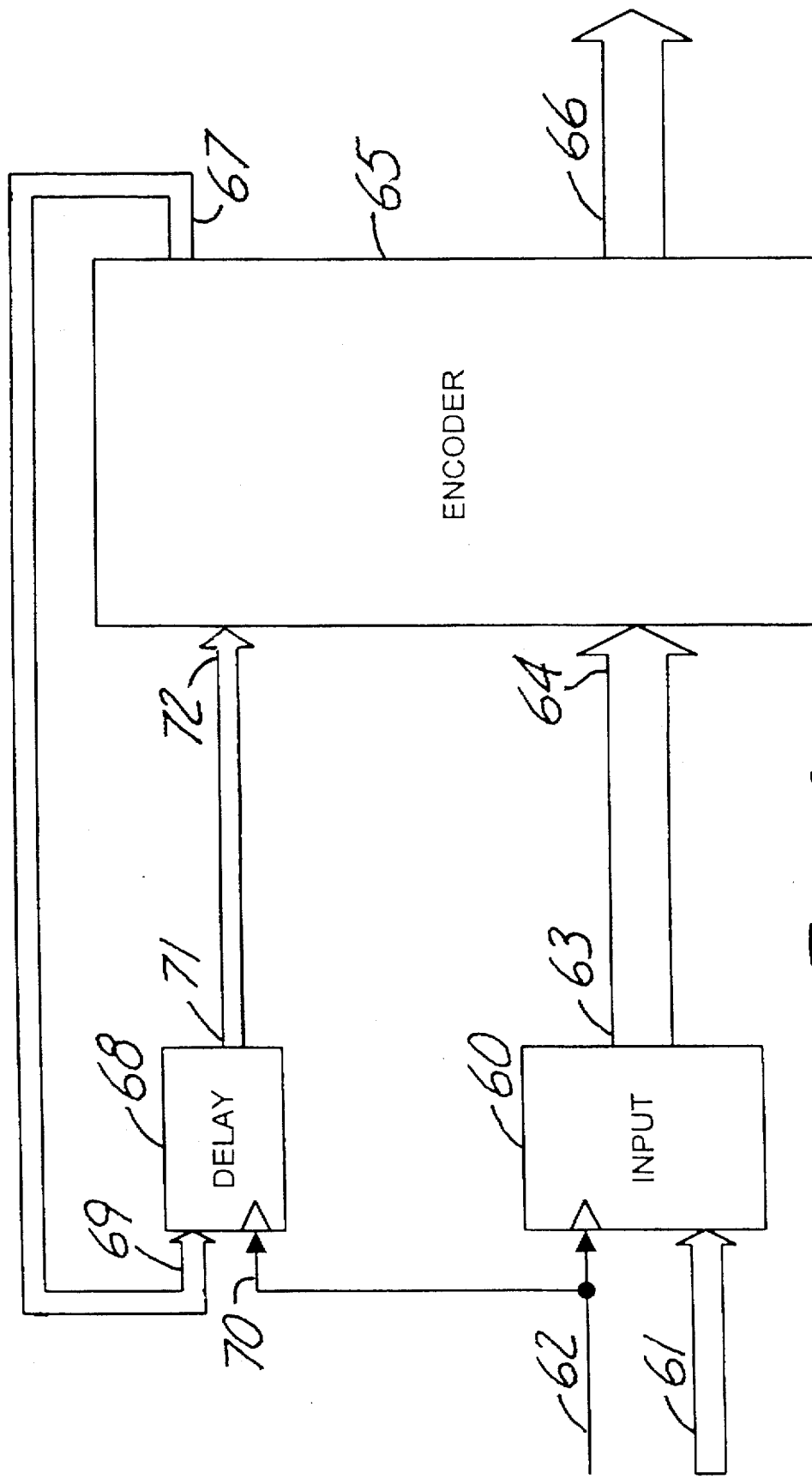
FIG. 9A is a block diagram of an encoder for the 6/7 rate code of FIG. 8.

In the encoder for implementing this maximum transition run code having a 6/7 rate shown in block diagram form in FIG. 9A comprising a finite state machine based on FIG. 8, each data word of six bits ($A_5$, $A_4$, $A_3$, $A_2$, $A_1$, $A_0$) is successively supplied to a clocked six bit input register, 60, at a system input, 61, during a corresponding period of the system clocking signal supplied at a clock signal input, 62. Each such input data word stored in input register 60 is transferred during the next clock period from an output, 63, of that register into an input, 64, of an encoder, 65, comprising a finite state machine based on the table in FIG. 8 to be encoded into a code word of seven bits ($C_6$, $C_5$, $C_4$, $C_3$, $C_2$, $C_1$, $C_0$) provided at a code word output, 66, of that encoder.

The data words associated with code words of Group BD' for branching from state $S_1$ (located by their hex values in FIGS. 7 and 8), and those data words associated with code words of Group CD' for branching from state $S_2$ (similarly located) can be identified by the following equations taking a Boolean value of 1:

$$K_{bd}=(\bar{A}_3*\bar{H}_0*\bar{H}_7)+(A_3*\bar{H}_{14}*\bar{H}_{15}) \qquad [\text{Eq. 62}]$$

and $$K_{cd}=((\bar{A}_3*\bar{H}_0*\bar{H}_7)+(A_3*\bar{H}_{14}*\bar{H}_{15}))*(A_4+A_5). \qquad [\text{Eq. 63}]$$

The corresponding Boolean variables $H_x$ are defined below.

The code word bits of the code words for branchings from state $S_0$ in the table of FIG. 8 can be expressed as follows for use in encoder 65:

$$YA_6=\bar{A}_5+(A_5*(A_3+H_0+H_7)), \qquad [\text{Eq. 64}]$$

$$YA_5=(\bar{H}_{15}*(G_0+(G_1*(A_3+\bar{A}_2))))+A_5*\bar{H}_8*\bar{H}_{15}*(\bar{A}_3*A_0+H_0+A_4)\text{Eq. 65}]$$

$$YA_4=(G_1*(H_5+H_7))+A_5*(H_2+H_3+H_6+H_{15}), \qquad [\text{Eq. 66}]$$

$$YA_3=((G_0+G_1)*\bar{A}_3*A_1)+(A_3*A_2*\bar{H}_{15})+((A_5+A_4)*\bar{A}_3*A_2), \qquad [\text{Eq. 67}]$$

$$YA_2=(G_0*\bar{A}_3*A_0)+(A_3*A_1*\bar{H}_{15})+(G_1*\bar{A}_3*\bar{A}_2*A_0), \qquad [\text{Eq. 68}]$$

$$YA_1=(A_3*A_0)+(A_4*\bar{A}_3*A_2)+(A_5*\bar{A}_3), \qquad [\text{Eq. 69}]$$

$$YA_0=(\bar{A}_3+H_{15})+(A_5*H_8), \qquad [\text{Eq. 70}]$$

where the corresponding Boolean variables $G_x$ and $H_x$ are defined below.

The two bits representing the next state for the code words for branchings from state $S_0$ out of the four possible next states can be expressed as follows for use in encoder 65:

$$NA_1=A_5+(G_0*(\bar{A}_3+H_{15}))+(G_1*(\bar{A}_3*A_2+H_{15})), \qquad [\text{Eq. 71}]$$

$$NA_0=(G_0*\bar{A}_3*A_2)+(G_1*\bar{H}_4*\bar{H}_5)+G_3. \qquad [\text{Eq. 72}]$$

The code word bits of the code words for branchings from state $S_1$ in the table of FIG. 8 can be expressed as follows for use in encoder 65:

$$YB_6=1 \qquad [\text{Eq. 73}]$$

$$YB_5=0 \qquad [\text{Eq. 74}]$$

$$YB_4=(K_{bd}*A_3)+H_{14}+H_{15} \qquad [\text{Eq. 75}]$$

$$YB_3=(K_{bd}*A_2)+H_7+(H_{15}*(A_4+A_5))+(H_0*\bar{A}_4*\bar{A}_5) \qquad [\text{Eq. 76}]$$

$$YB_2=(K_{bd}*A_1)+H_0+(H_{14}*(A_4+A_5))+(H_7*\bar{A}_4*\bar{A}_5) \qquad [\text{Eq. 77}]$$

$$YB_1=(K_{bd}*A_0) \qquad [\text{Eq. 78}]$$

$$YB_0=\bar{K}_{bd} \qquad [\text{Eq. 79}]$$

The two bits representing the next state for the code words for branchings from state $S_1$ can be expressed as follows for use in encoder 65:

$$NB_1=A_5+((H_0+H_7+H_{14}+H_{15})*G_0) \qquad [\text{Eq. 80}]$$

$$NB_0=A_4+(A_2*A_1*A_0*G_0) \qquad [\text{Eq. 81}]$$

The code word bits of the code words for branchings from state $S_2$ in the table of FIG. 8 can be expressed as follows for use in encoder 65:

$$YC_6=0 \qquad [\text{Eq. 82}]$$

$$YC_5=(K_{cd}*A_0)+H_{14}+H_{15}+H_5+H_{13} \qquad [\text{Eq. 83}]$$

$$YC_4=(K_{cd}*A_1)+(A_1*\bar{A}_2)+(G_0*(H_1+H_4+H_9+H_{12})) \qquad [\text{Eq. 84}]$$

$$YC_3=(K_{cd}*A_2)+(G_0*(\bar{A}_2*(A_1+A_0)))+H_4+H_7+H_{12}+H_{15} \qquad [\text{Eq. 85}]$$

$$YC_2=(K_{cd}*A_3)+H_7+H_{15} \qquad [\text{Eq. 86}]$$

$$YC_1=(G_0*\bar{A}_0)+H_0+H_{14} \qquad [\text{Eq. 87}]$$

$$YC_0=K_{cd}+H_6+H_8 \qquad [\text{Eq. 88}]$$

The two bits representing the next state for the code words for branchings from state $S_2$ can be expressed as follows for use in encoder 65:

$$NC_1 = A_5 + (G_0 * ((A_3 * \bar{A}_2) + H_6 + H_{12}))$$ [Eq. 89]

$$NC_0 = A_4 + (G_0 * (H_3 + H_4 + H_5 + H_6 + H_{11} + H_{12}))$$ [Eq. 90]

The code word bits of the code words for branchings from state $S_3$ in the table of FIG. 8 can be expressed as follows for use in encoder 65:

$$YD_6 = 0$$ [Eq. 91]

$$YD_5 = A_3$$ [Eq. 92]

$$YD_4 = A_2$$ [Eq. 93]

$$YD_3 = \bar{A}_2 * A_1$$ [Eq. 94]

$$YD_2 = (\bar{A}_2 * \bar{A}_1) + (A_2 * A_1)$$ [Eq. 95]

$$YD_1 = A_0$$ [Eq. 96]

$$YD_0 = 0$$ [Eq. 97]

The two bits representing the next state for the code words for branchings from state $S_3$ can be expressed as follows for use in encoder 65:

$$ND_1 = A_5$$ [Eq. 98]

$$ND_0 = A_4$$ [Eq. 99]

The corresponding Boolean variables $G_x$ and $H_x$ used in the preceding encoding expressions for the code word bits are defined as follows:

$$G_0 = \bar{A}_5 * \bar{A}_4$$ [Eq. 100]

$$G_1 = \bar{A}_5 * A_4$$ [Eq. 101]

$$G_2 = A_5 * \bar{A}_4$$ [Eq. 102]

$$G_3 = A_5 * A_4$$ [Eq. 103]

$$H_0 = \bar{A}_3 * \bar{A}_2 * \bar{A}_1 * \bar{A}_0$$ [Eq. 104]

$$H_1 = \bar{A}_3 * \bar{A}_2 * \bar{A}_1 * A_0$$ [Eq. 105]

$$H_2 = \bar{A}_3 * \bar{A}_2 * A_1 * \bar{A}_0$$ [Eq. 106]

$$H_3 = \bar{A}_3 * \bar{A}_2 * A_1 * A_0$$ [Eq. 107]

$$H_4 = \bar{A}_3 * A_2 * \bar{A}_1 * \bar{A}_0$$ [Eq. 108]

$$H_5 = \bar{A}_3 * A_2 * \bar{A}_1 * A_0$$ [Eq. 109]

$$H_6 = \bar{A}_3 * A_2 * A_1 * \bar{A}_0$$ [Eq. 110]

$$H_7 = \bar{A}_3 * A_2 * A_1 * A_0$$ [Eq. 111]

$$H_8 = A_3 * \bar{A}_2 * \bar{A}_1 * \bar{A}_0$$ [Eq. 112]

$$H_9 = A_3 * \bar{A}_2 * \bar{A}_1 * A_0$$ [Eq. 113]

$$H_{10} = A_3 * \bar{A}_2 * A_1 * \bar{A}_0$$ [Eq. 114]

$$H_{11} = A_3 * \bar{A}_2 * A_1 * \bar{A}_0$$ [Eq. 115]

$$H_{12} = A_3 * A_2 * \bar{A}_1 * \bar{A}_0$$ [Eq. 116]

$$H_{13} = A_3 * A_2 * \bar{A}_1 * A_0$$ [Eq. 117]

$$H_{14} = A_3 * A_2 * A_1 * \bar{A}_0$$ [Eq. 118]

$$H_{15} = A_3 * A_2 * A_1 * A_0$$ [Eq. 119]

The output code words of the encoder are formed by the code word bits $C_6$, $C_5$, $C_4$, $C_3$, $C_2$, $C_1$ and $C_0$ formed by selecting the proper one of the corresponding preceding code word bit expressions from each of the four sets thereof through use of the next state expression associated therewith delayed by one state transition (or one system clock period) to provide the current state indication therefor, the expressions for the seven code word bits being as follows:

$$C_6 = (\bar{Ks}_1 * \bar{Ks}_0) * YA_6 + (\bar{Ks}_1 * Ks_0) * YB_6 + (Ks_1 * \bar{Ks}_0) * YC_6 + (Ks_1 * Ks_0) * YD_6$$ [Eq. 120]

$$C_5 = (\bar{Ks}_1 * \bar{Ks}_0) * YA_5 + (\bar{Ks}_1 * Ks_0) * YB_5 + (Ks_1 * \bar{Ks}_0) * YC_5 + (Ks_1 * Ks_0) * YD_5$$ [Eq. 121]

$$C_4 = (\bar{Ks}_1 * \bar{Ks}_0) * YA_4 + (\bar{Ks}_1 * Ks_0) * YB_4 + (Ks_1 * \bar{Ks}_0) * YC_4 + (Ks_1 * Ks_0) * YD_4$$ [Eq. 122]

$$C_3 = (\bar{Ks}_1 * \bar{Ks}_0) * YA_3 + (\bar{Ks}_1 * Ks_0) * YB_3 + (Ks_1 * \bar{Ks}_0) * YC_3 + (Ks_1 * Ks_0) * YD_3$$ [Eq. 123]

$$C_2 = (\bar{Ks}_1 * \bar{Ks}_0) * YA_2 + (\bar{Ks}_1 * Ks_0) * YB_2 + (Ks_1 * \bar{Ks}_0) * YC_2 + (Ks_1 * Ks_0) * YD_2$$ [Eq. 124]

$$C_1 = (\bar{Ks}_1 * \bar{Ks}_0) * YA_1 + (\bar{Ks}_1 * Ks_0) * YB_1 + (Ks_1 * \bar{Ks}_0) * YC_1 + (Ks_1 * Ks_0) * YD_1$$ [Eq. 125]

$$C_0 = (\bar{Ks}_1 * \bar{Ks}_0) * YA_0 + (\bar{Ks}_1 * Ks_0) * YB_0 + (Ks_1 * \bar{Ks}_0) * YC_0 + (Ks_1 * Ks_0) * YD_0$$ [Eq. 126]

The associated next state is selected in the same manner resulting in the two bits representing the next state being expressed as follows:

$$Ns_1 = (\bar{Ks}_1 * \bar{Ks}_0) * NA_1 + (\bar{Ks}_1 * Ks_0) * NB_1 + (Ks_1 * \bar{Ks}_0) * NC_1 + (Ks_1 * Ks_0) * ND_1$$ [Eq. 127]

$$Ns_0 = (\bar{Ks}_1 * \bar{Ks}_0) * NA_0 + (\bar{Ks}_1 * Ks_0) * NB_0 + (Ks_1 * \bar{Ks}_0) * NC_0 + (Ks_1 * Ks_0) * ND_0$$ [Eq. 128]

where $(Ks_1, Ks_0)$ is an ordered pair of bits representing the current state. $(Ks_1, Ks_0)$ equal to the Boolean values (0,0) represents state $S_0$, equal to (0,1) represents state $S_1$, equal to (1,0) represents state $S_2$ and equal to (1,1) represents state $S_3$. Here $(Ks_1, Ks_0)$ are bits representing the current state, and are the bits $(Ns_1, Ns_0)$ provided at a next state output, 67, of encoder 65 delayed by one state transition, or clock period, in a clocked two bit delay register, 68, having its next state input, 69, connected to encoder output 67. The system clock signal is also provided to register 68 at a clocking input, 70, thereof. An output, 71, of register 68 is connected to a current state input, 72, of encoder 65.

Figure 9B:
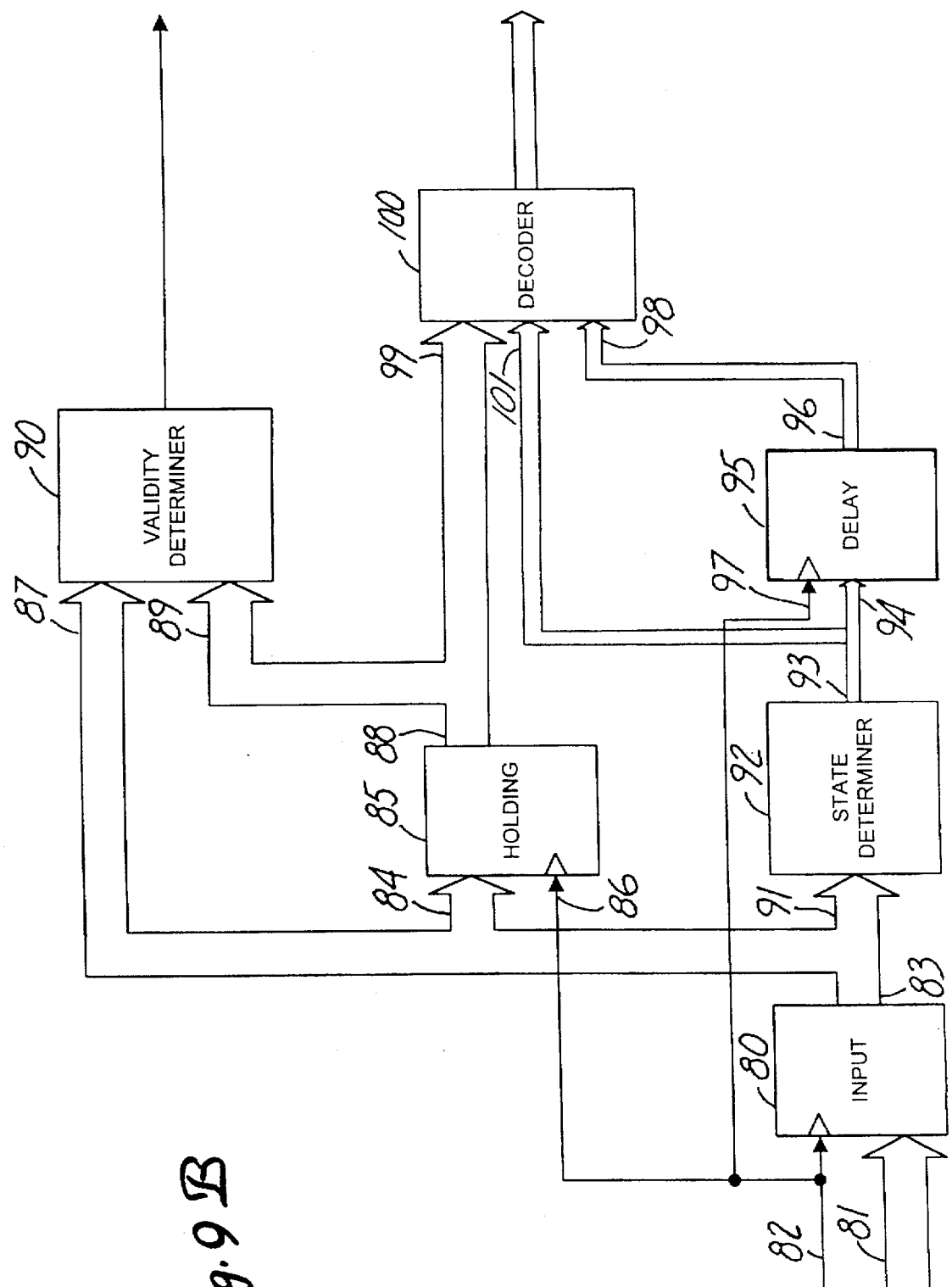
FIG. 9B is a block diagram of a decoder for the 6/7 rate code of FIG. 8.

In the corresponding decoder system for this 6/7 rate MTR code shown in block diagram form in FIG. 9B, output data words formed of six bits $A_5$, $A_4$, $A_3$, $A_2$, $A_1$ and $A_0$ are recovered based on successive pairs of input code words of seven bits each taken from the sequence of code words where each input code word in such a pair is in succession in the sequence thereof. Current code words, formed of the bits $C_6$, $C_5$, $C_4$, $C_3$, $C_2$, $C_1$ and $C_0$, provide the information as to the corresponding current states of the encoder, and the next following code word of each current code word, formed by the bits $C_{13}$, $C_{12}$, $C_{11}$, $C_{10}$, $C_9$, $C_8$ and $C_7$, provides the information as to the corresponding next state. Together, they point to the corresponding unique data word to result from the decoding.

In this decoder system, each input code word of seven bits is successively supplied to a clocked seven bit input register, 80, at a system input, 81, during a corresponding period of the system clocking signal supplied at a clock signal input, 82. Each such input data word stored in input register 80 represents the following or next code word ($C_{13}$, $C_{12}$, $C_{11}$, $C_{10}$, $C_9$, $C_8$, $C_7$) after storage in input register 80, but is transferred during the next clock period from an output, 83, of that register into an input, 84, of another clocked seven bit holding register, 85, where it becomes the current code word ($C_6$, $C_5$, $C_4$, $C_3$, $C_2$, $C_1$, $C_0$) after storage therein. The system clock signal is also applied to a clocking input, 86, of register 85. The new input code word stored in input register 80 during the time the preceding code word is stored in holding register 85 then becomes the next code word during the time held in register 80.

The code word in input register 80, as the next code word, is also supplied at output 83 thereof to a first input, 87, as is the current code word from an output, 88, of delay register 85 to a second input, 89, of a code word legality checker, 90. If the seven code bits in any code word received form an illegal code word representing an eliminated seven bit word (any of the words that were eliminated in forming Groups AA, AB, AC, AD, BB, BD', CC, CD', D' and D" above), a flag signal taking a Boolean value of 1 at the output of checker 90 will indicate so as a basis for a user to arrange some corresponding action if desired. This flag signal LL as implemented in checker 90 can be expressed as:

$$LL = L_1 + L_2 + L_3 + L_4, \qquad \text{[Eq. 129]}$$

where $$L_1 = C_6*C_5*C_4 + C_5*C_4*C_3 + C_4*C_3*C_2 + C_3*C_2*C_1 + C_2*C_1*C_0, \qquad \text{[Eq. 130]}$$

$$L_2 = \bar{C}_6*\bar{C}_5*\bar{C}_4*\bar{C}_3*\bar{C}_2*\bar{C}_1 + \bar{C}_5*\bar{C}_4*\bar{C}_3*\bar{C}_2*\bar{C}_1*\bar{C}_0, \qquad \text{[Eq. 131]}$$

$$L_3 = C_{13}*C_{12}*C_{11} + C_{12}*C_{11}*C_{10} + C_{11}*C_{10}*C_9 + C_{10}*C_9*C_8 + C_9*C_8*C_7, \qquad \text{[Eq. 132]}$$

$$L_4 = \bar{C}_{13}*\bar{C}_{12}*\bar{C}_{11}*\bar{C}_{10}*\bar{C}_9*\bar{C}_8 + \bar{C}_{12}*\bar{C}_{11}*\bar{C}_{10}*\bar{C}_9*\bar{C}_8*\bar{C}_7. \qquad \text{[Eq. 133]}$$

The code words can be divided into groups AA, AB, AC, AD', BB, BD, CC', CD, D' and D" as described above. Group AD' is formed by removing code word 1000001 therefrom as indicated above, and its occurrence in a transition from state $S_0$ is provided for directly in the decoder data word digit expressions below. Similarly, Group CC' is formed by removing code word 0000011 therefrom as indicated above, and its occurrence in a transition from state $S_2$ is also provided for directly in the decoder data word digit expressions below. Groups BD and CD are used rather than Groups BD' and CD' resulting from the removal of code words 1000000 and 0000001 therefrom, respectively, as indicated above, and relying on signal LL to indicate their occurrence. Current state code words can be identified as belonging to Groups AA, AB, AC, AD', BB, BD, CC', CD, D' and D" by the corresponding variables $K_{aa}$, $K_{ab}$, $K_{ac}$, $K_{ad}$, $K_{bb}$, $K_{bd}$, $K_{cc}$, $K_{cd}$, $K_{d'}$ and $K_{d''}$ in the expressions below taking a Boolean value of 1:

$$\text{Group AA) } K_{aa} = C_6*C_5*C_1*C_0, \qquad \text{[Eq. 134]}$$

$$\text{Group AB) } K_{ab} = C_6*C_5*\bar{C}_1*C_0, \qquad \text{[Eq. 135]}$$

$$\text{Group AC) } K_{ac} = C_6*\bar{C}_5*C_1*C_0, \qquad \text{[Eq. 136]}$$

$$\text{Group AD') } K_{ad} = C_6*\bar{C}_5*(C_4+C_3+C_2)*\bar{C}_1*C_0, \qquad \text{[Eq. 137]}$$

$$\text{Group BB') } K_{bb} = C_6*C_5*\bar{C}_0, \qquad \text{[Eq. 138]}$$

$$\text{Group BD) } K_{bd} = C_6*\bar{C}_5*\bar{C}_0, \qquad \text{[Eq. 139]}$$

$$\text{Group CC') } K_{cc} = \bar{C}_6*C_1*C_0*(C_5+C_4+C_3), \qquad \text{[Eq. 140]}$$

$$\text{Group CD) } K_{cd} = \bar{C}_6*\bar{C}_1*C_0, \qquad \text{[Eq. 141]}$$

$$\text{Group D") } K_{d''} = \bar{C}_6*\bar{C}_0*(\bar{C}_3*(C_4+C_2)+\bar{C}_4*C_3*\bar{C}_2), \qquad \text{[Eq. 142]}$$

$$\text{Group D') } K_{d'} = \bar{C}_6*\bar{C}_0*\overline{K_{d''}}. \qquad \text{[Eq. 143]}$$

The current states of the received code words imposed by the encoder can be expressed by the equations:

$$Ts_0 = K_{aa} + K_{ab} + K_{ac} + K_{bb} + K_{cc} + (C_6*\bar{C}_4*\bar{C}_3*\bar{C}_2*\bar{C}_1), \qquad \text{[Eq. 144]}$$

$$Ts_1 = K_{ad} + K_{bd}, \qquad \text{[Eq. 145]}$$

$$Ts_2 = K_{cd} + K_{d'} + (\bar{C}_6*\bar{C}_5*\bar{C}_4*\bar{C}_3*C_0), \qquad \text{[Eq. 146]}$$

$$Ts_3 = K_{d''}. \qquad \text{[Eq. 147]}$$

The occurrence of $Ts_0$, $Ts_1$, $Ts_2$ or $Ts_3$ taking a Boolean value of 1 indicates that the current state is the corresponding one of states $S_0$, $S_1$, $S_2$ and $S_3$. These possible current four states can be represented in two bits by $Ks_1, Ks_0$ as follows:

$$Ks_0 = \overline{Ts}_0*Ts_1 + Ts_3, \qquad \text{[Eq. 148]}$$

$$Ks_1 = \overline{Ts}_0*Ts_2 + Ts_3. \qquad \text{[Eq. 149]}$$

($Ks_1, Ks_0$) is an ordered pair of bits representing the current state. ($Ks_1, Ks_0$) equal to (0,0) represents state $S_0$, equal to (0,1) represents state $S_1$, equal to (1,0) represents state $S_2$ and equal to (1,1) represents state $S_3$.

Rather than using those expressions directly preceding the last two expressions to form these last two expression to obtain the current state, the decoder system determines the next state and then delays use of it for one state transition to thereby then have it represent the current state. This is accomplished through the code word in input register 80, as the next code word, being also supplied at output 83 thereof to an input, 91, of a state determiner, 92. Next state code words can be identified as belonging to Groups AA, AB, AC, AD', BB, BD, CC', CD, D' and D" by the corresponding variables $KK_{aa}$, $KK_{ab}$, $KK_{ac}$, $KK_{ad}$, $KK_{bb}$, $KK_{bd}$, $KK_{cc}$, $KK_{cd}$, $KK_{d'}$ and $KK_{d''}$ in the expressions below taking a Boolean value of 1:

$$\text{Group AA) } KK_{aa} = C_{13}*C_{12}*C_8*C_7, \qquad \text{[Eq. 150]}$$

$$\text{Group AB) } KK_{ab} = C_{13}*C_{12}*\bar{C}_8*C_7, \qquad \text{[Eq. 151]}$$

$$\text{Group AC) } KK_{ac} = C_{13}*\bar{C}_{12}*C_8*C_7, \qquad \text{[Eq. 152]}$$

$$\text{Group AD') } KK_{ad} = C_{13}*\bar{C}_{12}*(C_{11}+C_{10}+C_9)*\bar{C}_8*C_7, \qquad \text{[Eq. 153]}$$

$$\text{Group BB') } KK_{bb} = C_{13}*C_{12}*\bar{C}_7, \qquad \text{[Eq. 154]}$$

$$\text{Group BD) } KK_{bd} = C_{13}*\bar{C}_{12}*\bar{C}_7, \qquad \text{[Eq. 155]}$$

$$\text{Group CC') } KK_{cc} = \bar{C}\_*C_8*C_7*(C_{12}+C_{11}+C_{10}), \qquad \text{[Eq. 156]}$$

$$\text{Group CD) } KK_{cd} = \bar{C}_{13}*\bar{C}_8*C_7, \qquad \text{[Eq. 157]}$$

$$\text{Group D") } KK_{d''} = \bar{C}_{13}*\bar{C}_7*(\bar{C}_{10}*(C_{11}+C_9)+\bar{C}_{11}*C_{10}*\bar{C}_9), \qquad \text{[Eq. 158]}$$

$$\text{Group D') } KK_{d'} = \bar{C}_{13}*\bar{C}_7*\overline{KK_{d''}}. \qquad \text{[Eq. 159]}$$

The next states of the encoder corresponding to the received code words can be expressed by the equations:

$$TTs_0 = KK_{aa} + KK_{ab} + KK_{ac} + KK_{bb} + KK_{cc} + (C_{13}*\bar{C}_{11}*\bar{C}_{10}*\bar{C}_9*\bar{C}_8), \qquad \text{[Eq. 160]}$$

$$TTs_1 = KK_{ad} + KK_{bd}, \qquad \text{[Eq. 161]}$$

$$TTs_2 = KK_{cd} + KK_{d'} + (\bar{C}_{13}*\bar{C}_{12}*\bar{C}_{11}*\bar{C}_{10}*C_7), \qquad \text{[Eq. 162]}$$

$$TTs_3 = KK_{d''}. \qquad \text{[Eq. 163]}$$

The occurrence of $TTs_0$, $TTs_1$, $TTs_2$ or $TTs_3$ taking a Boolean value of 1 indicates that the next state is the corresponding one of states $S_0$, $S_1$, $S_2$ and $S_3$. These possible four next states can be represented in two bits by $Ns_1$, $Ns_0$ as follows:

$$Ns_0 = \overline{TTs_0} * TTs_1 + TTs_3, \quad \text{[Eq. 164]}$$

$$Ns_1 = \overline{TTs_0} * TTs_2 + TTs_3, \quad \text{[Eq. 165]}$$

$(Ns_1, Ns_0)$ is an ordered pair of bits representing the next state. $(Ns_1, Ns_0)$ equal to the Boolean values $(0,0)$ represents state $S_0$, equal to $(0,1)$ represents state $S_1$, equal to $(1,0)$ represents state $S_2$, and equal to $(1,1)$ represents state $S_3$.

These expressions, implemented in determiner 92, provide the next state at an output, 93, thereof connected to an input, 94, of a clocked two bit delay register, 95, having an output, 96, at which is provided the current state indication. Delay register 95 also has a further clocking input, 97, to receive the system clock signal. Output 96 of delay register 95 is connected to a first input, 98, and output 88 of holding register 35 is connected to a second input, 99, of a decoder, 100, to thereby provide the current state indication and the current code word to that decoder. In addition, output 93 of state determiner 92 is connected to decoder 100 at a third input, 101, thereof to provide the next state indication thereto.

The data word bits recovered from received code words arising on branchings from state $S_0$ during state transitions as set out in the table of FIG. 8 can be expressed as follows for use in decoder 100 based on the variables for identifying code words from Groups AA, AB, AC, BB and CC:

$$XA_5 = K_{aa} + (C_4 * \bar{C}_3 * K_{ac}) + (NS_1 * (K_{bb} + K_{cc} + PP)), \quad \text{[Eq. 166]}$$

$$XA_4(Ns_0 * (K_{aa} + K_{bb} + K_{cc} + PP)) + (\overline{Ns_1} * K_{ab}) + ((C_3 + Ns_0) * K_{ac}, \quad \text{[Eq. 167]}$$

$$XA_3 = (\bar{C}_3 * K_{ac}) + K_{bb} + PP, \quad \text{[Eq. 168]}$$

$$XA_2 = (C_3 * (K_{aa} + K_{bb} + K_{cc})) + (Ns_0 * Ns_1 * K_{ab}) + K_{ac}, \quad \text{[Eq. 169]}$$

$$XA_1 = (C_3 * (K_{aa} + K_{ab})) + (\bar{C}_3 + C_3 * Ns_0)) * K_{ac} + (C_2 * K_{bb}) + (C_4 * K_{cc}), \quad \text{[Eq. 170]}$$

$$XA_0 = (C_3 * K_{aa}) + (C_2 * K_{ab}) + (\bar{C}_3 + (C_3 * C_4)) * K_{ac} + (C_1 * K_{bb}) + (C_5 * K_{cc}), \quad \text{[Eq. 171]}$$

where $$PP = (G_6 * H_0) + (G_4 * H_1), \quad \text{[Eq. 172]}$$

and $G_x$ and $H_x$ are defined below.

The data word bits recovered from received code words arising on branchings from state $S_1$ during state transitions as set out in the table of FIG. 8 can be expressed as follows for use in decoder 100 based on the variables for identifying code words from Groups AD' and BD:

$$XB_5 = Ns_1 * (K_{bd} + (H_5 + H_9) * K_{ad}), \quad \text{[Eq. 173]}$$

$$XB_4 = Ns_0 * (K_{bd} + (H_5 + H_9) * K_{ad}), \quad \text{[Eq. 174]}$$

$$XB_3 = C_4 * (K_{bd} + K_{ad}), \quad \text{[Eq. 175]}$$

$$XB_2 = (C_3 * K_{bd}) + (C_4 + H_9 + H_{13} * Ns_0) * K_{ad}, \quad \text{[Eq. 176]}$$

$$XB_1 = (C_2 * K_{bd}) + (C_4 + H_9 + H_{13} * Ns_0) * K_{ad}, \quad \text{[Eq. 177]}$$

$$XB_0 = (C_1 * K_{bd}) + (C_3 * \bar{C}_2 + \bar{H}_5 * Ns_0) * K_{ad}. \quad \text{[Eq. 178]}$$

The data word bits recovered from received code words arising on branchings from state $S_2$ during state transitions as set out in the table of FIG. 8 can be expressed as follows for use in decoder 100 based on the variables for identifying code words from Groups CD and D':

$$XC_5 = (Ns_1 * K_{cd}) + ((\bar{C}_4 * C_1 + C_3 * C_2) * Ns_1 * K_{d'}), \quad \text{[Eq. 179]}$$

$$XC_4 = (Ns_0 * K_{cd}) + ((\bar{C}_4 * C_1 + C_3 * C_2) * Ns_0 * K_{d'}), \quad \text{[Eq. 180]}$$

$$XC_3 = (C_2 * K_{cd}) + (C_4 * NS_1 + C_5 * (C_2 + C_1 + (\bar{C}_2 * \bar{C}_1 * \overline{Ns_0}))) * K_{d'} + (G_0 * H_3 * Ns_0), \quad \text{[Eq. 181]}$$

$$XC_2 = (C_3 * K_{cd}) + (C_4 * C_1 * Ns_0 + C_3 * C_2 + C_5) * K_{d'} + (G_0 * H_3 * Ns_0), \quad \text{[Eq. 182]}$$

$$XC_1 = (C_4 * K_{cd}) + (C_4 * (\bar{C}_1 * Ns_0 + C_1 * \overline{Ns_0}) + C_3 * C_2 + C_5 * C_1) * K_{d'} + (G_0 * H_3 * Ns_0), \quad \text{[Eq. 183]}$$

$$XC_0 = (C_5 * K_{cd}) + (\bar{C}_1 * K_{d'}). \quad \text{[Eq. 184]}$$

The data word bits recovered from received code words arising on branchings from state $S_3$ during state transitions as set out in the table of FIG. 8 can be expressed as follows for use in decoder 100 based on the variables for identifying code words from Group D":

$$XD_5 = NS_1 * K_{d''}, \quad \text{[Eq. 185]}$$

$$XD_4 = NS_0 * K_{d''}, \quad \text{[Eq. 186]}$$

$$XD_3 = C_5 * K_{d''}, \quad \text{[Eq. 187]}$$

$$XD_2 = C_4 * K_{d''}, \quad \text{[Eq. 188]}$$

$$XD_1 = (C_4 * C_2 + \bar{C}_4 * \bar{C}_2) * K_{d''}, \quad \text{[Eq. 189]}$$

$$XD_0 = C_1 * K_{d''}, \quad \text{[Eq. 190]}$$

The corresponding Boolean variables $G_x$ and $H_x$ used in the preceding decoding expressions for the data word bits are defined as follows:

$$G_0 = \bar{C}_6 * \bar{C}_5 * \bar{C}_4, \quad \text{[Eq. 191]}$$

$$G_1 = \bar{C}_6 * \bar{C}_5 * C_4, \quad \text{[Eq. 192]}$$

$$G_2 = \bar{C}_6 * C_5 * \bar{C}_4, \quad \text{[Eq. 193]}$$

$$G_3 = \bar{C}_6 * C_5 * C_4, \quad \text{[Eq. 194]}$$

$$G_4 = C_6 * \bar{C}_5 * \bar{C}_4, \quad \text{[Eq. 195]}$$

$$G_5 = C_6 * \bar{C}_5 * C_4, \quad \text{[Eq. 196]}$$

$$G_6 = C_6 * C_5 * \bar{C}_4, \quad \text{[Eq. 197]}$$

$$G_7 = C_6 * C_5 * C_4, \quad \text{[Eq. 198]}$$

$$H_0 = \bar{C}_3 * \bar{C}_2 * \bar{C}_1 * \bar{C}_0, \quad \text{[Eq. 199]}$$

$$H_1 = \bar{C}_3 * \bar{C}_2 * \bar{C}_1 * C_0, \quad \text{[Eq. 200]}$$

$$H_2 = \bar{C}_3 * \bar{C}_2 * C_1 * \bar{C}_0, \quad \text{[Eq. 201]}$$

$$H_3 = \bar{C}_3 * \bar{C}_2 * C_1 * C_0, \quad \text{[Eq. 202]}$$

$$H_4 = \bar{C}_3 * C_2 * \bar{C}_1 * \bar{C}_0, \quad \text{[Eq. 203]}$$

$$H_5 = \bar{C}_3 * C_2 * \bar{C}_1 * C_0, \quad \text{[Eq. 204]}$$

$$H_6 = \bar{C}_3 * C_2 * C_1 * \bar{C}_0, \quad \text{[Eq. 205]}$$

$$H_7 = \bar{C}_3 * C_2 * C_1 * C_0, \quad \text{[Eq. 206]}$$

$$H_8 = C_3 * \bar{C}_2 * \bar{C}_1 * \bar{C}_0, \quad \text{[Eq. 207]}$$

$$H_9 = C_3 * \bar{C}_2 * \bar{C}_1 * C_0, \quad \text{[Eq. 208]}$$

$$H_{10} = C_3 * \bar{C}_2 * C_1 * \bar{C}_0, \quad \text{[Eq. 209]}$$

$$H_{11} = C_3 * \bar{C}_2 * C_1 * C_0, \quad \text{[Eq. 210]}$$

$$H_{12} = C_3 * C_2 * \bar{C}_1 * \bar{C}_0, \quad \text{[Eq. 211]}$$

$$H_{13} = C_3 * C_2 * \bar{C}_1 * C_0, \quad \text{[Eq. 212]}$$

$$H_{14} = C_3 * C_2 * C_1 * \bar{C}_0, \quad \text{[Eq. 213]}$$

$$H_{15}=C_3*C_2*C_1*C_0, \quad \text{[Eq. 214]}$$

The output data words of the encoder are provided by the code word bits $A_5$, $A_4$, $A_3$, $A_2$, $A_1$ and $A_0$ at the output of decoder 100 formed by selecting the proper one of the corresponding four preceding data word bit expressions through use of the two next state expressions delayed by one state transition (or one system clock period) to provide the current state indication, the expressions therefor being as follows:

$$A_5=(\overline{Ks}_1*\overline{Ks}_0)*XA_5+(\overline{Ks}_1*Ks_0)*XB_5+(Ks_1*\overline{Ks}_0)*XC_5+(Ks_1*Ks_0)*XD_5, \quad \text{[Eq. 215]}$$

$$A_4=(\overline{Ks}_1*\overline{Ks}_0)*XA_4+(\overline{Ks}_1*Ks_0)*XB_4+(Ks_1*\overline{Ks}_0)*XC_4+(Ks_1*Ks_0)*XD_4, \quad \text{[Eq. 216]}$$

$$A_3=(\overline{Ks}_1*\overline{Ks}_0)*XA_3+(\overline{Ks}_1*Ks_0)*XB_3+(Ks_1*\overline{Ks}_0)*XC_3+(Ks_1*Ks_0)*XD_3, \quad \text{[Eq. 217]}$$

$$A_2=(\overline{Ks}_1*\overline{Ks}_0)*XA_2+(\overline{Ks}_1*Ks_0)*XB_2+(Ks_1*\overline{Ks}_0)*XC_2+(Ks_1*Ks_0)*XD_2, \quad \text{[Eq. 218]}$$

$$A_1=(\overline{Ks}_1*\overline{Ks}_0)*XA_1+(\overline{Ks}_1*Ks_0)*XB_1+(Ks_1*\overline{Ks}_0)*XC_1+(Ks_1*Ks_0)*XD_1, \quad \text{[Eq. 219]}$$

$$A_0=(\overline{Ks}_1*\overline{Ks}_0)*XA_0+(\overline{Ks}_1*Ks_0)*XB_0+(Ks_1*\overline{Ks}_0)*XC_0+(Ks_1*Ks_0)*XD_0, \quad \text{[Eq. 220]}$$

$(Ks_1,Ks_0)$ is an ordered pair of bits representing the current state indication provided at the output of delay register 95.

Although the present invention has been described with reference to preferred embodiments, workers skilled in the art will recognize that changes may be made in form and detail without departing from the spirit and scope of the invention.

What is claimed is:

1. An apparatus for encoding selected data blocks having a selected data number of ordered symbols therein into corresponding code blocks having a selected code number of ordered symbols therein with said code number being greater than said data number, the apparatus comprising:

a encoding receiver for receiving said data blocks; and an encoder coupled to said encoding receiver for providing a corresponding said code block for each said data block, such that (a) each said code block and any concatenations of said code blocks are without more than a preselected first symbol number of successive repetitions of a first symbol throughout, and without more than a preselected second symbol number of successive repetitions of a second symbol throughout, and (b) any of said code blocks, there are provided for each of plural different ones of said data blocks, are also provided, in representing a said data block, in a concatenation of said code blocks such that such a said plural representation code block together with at least one other said code block in that said concatenation therewith are sufficient to determine which of said different ones of said data blocks representable by said plural representation code block is being represented.

2. The apparatus of claim 1 wherein each code block is represented with binary number system symbols such that said first symbol is a "0" and said second is a "1".

3. The apparatus of claim 1 wherein said first symbol number equals nine.

4. The apparatus of claim 1 wherein said second symbol number equals two.

5. The apparatus of claim 1 wherein said selected data number equals five, and wherein said selected code number equals six.

6. The apparatus of claim 1 wherein said selected data number equals six, and wherein said selected code number equals seven.

7. The apparatus of claim 1 whereto said encoder is based on a finite state machine formed in a microprocessor.

8. The apparatus of claim 2 wherein said first symbol number equals nine.

9. The apparatus of claim 2 wherein said second symbol number equals two.

10. The apparatus of claim 2 wherein said selected data number equals five, and wherein said selected code number equals six.

11. The apparatus of claim 2 wherein said selected data number equals six, and wherein said selected code number equals seven.

12. The apparatus of claim 2 wherein said encoder is based on a finite state machine formed in a microprocessor.

13. The apparatus of claim 12 wherein said code blocks are divided into classes of mutually exclusive code blocks with a different one of such classes being assigned to transitions from each state to another state in response to receipt of a corresponding data block to thereby arise as corresponding encoder outputs as a result of such transitions.

14. The apparatus of claim 13 wherein said classes are each divided into subclasses based on that next state to which a said transition leads with code blocks from each class being permitted to be in plural ones of those said subclasses formed from that class.

15. The apparatus of claim 14 further comprising a decoding receiver for receiving code blocks encoding corresponding said data blocks in that manner followed by said encoder so as to permit storing successive code blocks received therein concurrently, and a decoder for obtaining data blocks corresponding to said received code blocks and corresponding next states therefor.

16. An apparatus for decoding selected code blocks having a selected code number of ordered symbols therein into corresponding data blocks having a selected data number of ordered symbols therein with said code number being greater than said data number, the apparatus comprising:

a decoding receiver for receiving said code blocks; and an decoder coupled to said decoding receiver for providing a corresponding said data block for each said code block, wherein (a) each said code block and any concatenations of said code blocks are without more than a preselected first symbol number of successive repetitions of a first symbol throughout, and without more than a preselected second symbol number of successive repetitions of a second symbol throughout, and (b) any of said code blocks, that are provided for each of plural different ones of said data blocks, are also provided, in representing a said data block, in a concatenation of said code blocks such that such a said plural representation code block together with at least one other said code block in that said concatenation therewith are sufficient to determine which of said different ones of said data blocks representable by said plural representation code block is being represented.

17. The apparatus of claim 16 wherein said first symbol number equals nine and said second symbol number equals two.

18. The apparatus of claim 16 wherein the decoding receiver comprises:

a first register, having an input for receiving code blocks, and an output for providing received code blocks;

a second register, having an input for receiving code blocks, the input coupled to the output of the first register, the second register also having an output from providing received code blocks, the output of the second register coupled to the decoder;

a state determiner, having an input coupled to the output of the first register, and an output coupled to the decoder, the state determiner for producing a value at its output representing the next state of the decoder corresponding to the code block at the output of the second register.

19. The apparatus of claim 18 wherein the decoding receiver further comprises:

a delay register having an input coupled to the output of the state determiner and an output coupled to the decoder, the output of the delay register for providing a current state of the decoder corresponding to the code block at the output of the second register.

* * * * *

UNITED STATES PATENT AND TRADEMARK OFFICE
CERTIFICATE OF CORRECTION

PATENT NO. : 5,731,768
DATED : MARCH 24, 1998
INVENTOR(S) : KINHING P. TSANG

It is certified that error appears in the above-identified patent and that said Letters Patent is hereby corrected as shown below:

On the title page, [57] ABSTRACT, line 7, after distinguishing, insert --which--

Col. 1, Line 37, delete "magnetizations" insert --magnetization reversals--

Col. 3, Line 20, delete "block," insert --blocks--

Col. 3, Line 41, delete "6obit" insert --6-bit--

Col. 5, Line 47, delete "associated branchings" insert --associated with branchings--

Col. 6, line 63, delete "$YB_4 = KK*(A_3 + A_2*A_1*A_0) + KK*H_0 + \overline{KK} * A_4$", insert --

$YB_4 = KK*(A_3 + A_2*A_1*A_0) + KK*H_0 + \overline{KK} * \overline{A}_4$ --

Col. 6, line 64, delete "$YB_3 = KK*(A_2*(\overline{A}_1 + \overline{A}_0) + H_0) + \overline{KK} * \overline{A}_4 A_2*A_1 + A_4*A_1)$", insert --$YB_3 = KK*(A_2*(\overline{A}_1 + \overline{A}_0) + H_0) + \overline{KK} * \overline{A}_4 * A_2*A_1 + A_4*A_1)$ --

Col. 8, line 32, delete "$Ts_1 = \overline{C}_5 * \overline{C}_0) + (\overline{C}_5 * C_0 * (\overline{C}_4 + C_4 * (\overline{C}_3 + (C_3 * \overline{C}_1))))$", insert --$Ts_1 = \overline{C}_5 * C_0) + (\overline{C}_5 * \overline{C}_0 * (\overline{C}_4 + C_4 * (\overline{C}_3 + (C_3 * \overline{C}_1))))$ --

Col 16, line 46, delete "$\overline{C}$ --", insert --$\overline{C}_{13}$--

Col. 16, Line 24, delete "these last two expression" and insert --these last two expressions--

UNITED STATES PATENT AND TRADEMARK OFFICE
CERTIFICATE OF CORRECTION

PATENT NO. : 5,731,768
DATED : MARCH 24, 1998
INVENTOR(S) : KINHING P. TSANG

It is certified that error appears in the above-identified patent and that said Letters Patent is hereby corrected as shown below:

Col. 18, line 6, delete "$XC_1=(C_4*K_{cd})+C_4*(\overline{C}_1*N_{So}+C_1*\overline{N}_{So})++C_3*C_2+C_5*C_1)*K_{d1}+(G_0*H_3*N_{so}$", insert --$XC_1=(C_4*K_{cd})+C_4*(\overline{C}_1*N_{So}+C_1*\overline{N}_{So})+C_3*C_2+C_5*C_1)*K_{d1}+(G_0*H_3*N_{so}$ --

Col. 19, Claim 1, Line 49, delete "there" and insert --that--

Signed and Sealed this

Third Day of August, 1999

Attest:

Q. TODD DICKINSON

*Attesting Officer*     *Acting Commissioner of Patents and Trademarks*